(12) United States Patent
Ishizaki

(10) Patent No.: US 10,038,014 B2
(45) Date of Patent: Jul. 31, 2018

(54) THIN FILM TRANSISTOR ARRAY

(71) Applicant: Toppan Printing Co., Ltd., Taito-ku (JP)

(72) Inventor: Mamoru Ishizaki, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 14/861,059

(22) Filed: Sep. 22, 2015

(65) Prior Publication Data

US 2016/0013213 A1    Jan. 14, 2016

Related U.S. Application Data

(63) Continuation of application No. PCT/JP2014/001300, filed on Mar. 7, 2014.

(30) Foreign Application Priority Data

Mar. 22, 2013   (JP) ................................. 2013-059410

(51) Int. Cl.
*H01L 27/12* (2006.01)
*H01L 29/417* (2006.01)
*H01L 29/08* (2006.01)

(52) U.S. Cl.
CPC ........ *H01L 27/1222* (2013.01); *H01L 27/124* (2013.01); *H01L 29/0847* (2013.01); *H01L 29/41733* (2013.01)

(58) Field of Classification Search
CPC . H01L 27/1214; H01L 27/124; H01L 29/786; H01L 27/1222
See application file for complete search history.

(56) References Cited

U.S. PATENT DOCUMENTS

2004/0031964 A1   2/2004  Morita et al.
2004/0066483 A1*  4/2004  Kim .................. G02F 1/134363
                                                              349/141
(Continued)

FOREIGN PATENT DOCUMENTS

JP    2002-190605 A    7/2002
JP    2005-019627 A    1/2005
(Continued)

OTHER PUBLICATIONS

International Search Report dated May 27, 2014 in PCT/JP2014/001300, filed Mar. 7, 2014.
(Continued)

*Primary Examiner* — Michele Fan
(74) *Attorney, Agent, or Firm* — Oblon, McClelland, Maier & Neustadt, L.L.P.

(57) ABSTRACT

A thin film transistor array including a gate wiring connected to a gate electrode and extended in a first direction, a source wiring connected to a source electrode, a drain electrode having a gap from the source electrode, a semiconductor pattern formed at least in a portion corresponding to the gap between the source and drain electrodes, the semiconductor pattern having a region defined by extending the portion in a second direction perpendicular to the first direction, and a pixel electrode that overlaps with a capacitor electrode in the planar view. In the planar view, the drain electrode has a shape of a single line, the source electrode has a first portion in a line shape and a second portion in a sheath shape surrounding the drain electrode and keeping a space from the drain electrode, and the source wiring is narrower than the region of the semiconductor pattern.

19 Claims, 15 Drawing Sheets

(56) References Cited

U.S. PATENT DOCUMENTS

| | | | |
|---|---|---|---|
| 2004/0125302 A1* | 7/2004 | Kim | G02F 1/133707 |
| | | | 349/141 |
| 2005/0272178 A1 | 12/2005 | Kim | |
| 2006/0237720 A1 | 10/2006 | Misaki | |
| 2008/0197348 A1 | 8/2008 | Matsubara et al. | |
| 2008/0239189 A1 | 10/2008 | Hatta et al. | |
| 2009/0283204 A1* | 11/2009 | Lee | C09K 19/42 |
| | | | 156/145 |
| 2010/0117075 A1* | 5/2010 | Akimoto | H01L 29/66742 |
| | | | 257/43 |
| 2012/0001189 A1* | 1/2012 | Matsubara | G02F 1/136286 |
| | | | 257/59 |
| 2014/0132867 A1* | 5/2014 | Cho | G02F 1/1368 |
| | | | 349/42 |

FOREIGN PATENT DOCUMENTS

| | | |
|---|---|---|
| JP | 2006-243344 A | 9/2006 |
| JP | 2007-134482 A | 5/2007 |
| JP | 2008-235861 A | 10/2008 |
| JP | 2008-270744 A | 11/2008 |
| JP | 2010-103283 A | 5/2010 |
| WO | WO 2010/ 107027 A1 | 9/2010 |

OTHER PUBLICATIONS

Shoichi Matsumoto, "Liquid Crystal Display Technology: Active Matrix LCDs", Sangyo Tosho, Nov. 1996, pp. 55-59.

* cited by examiner

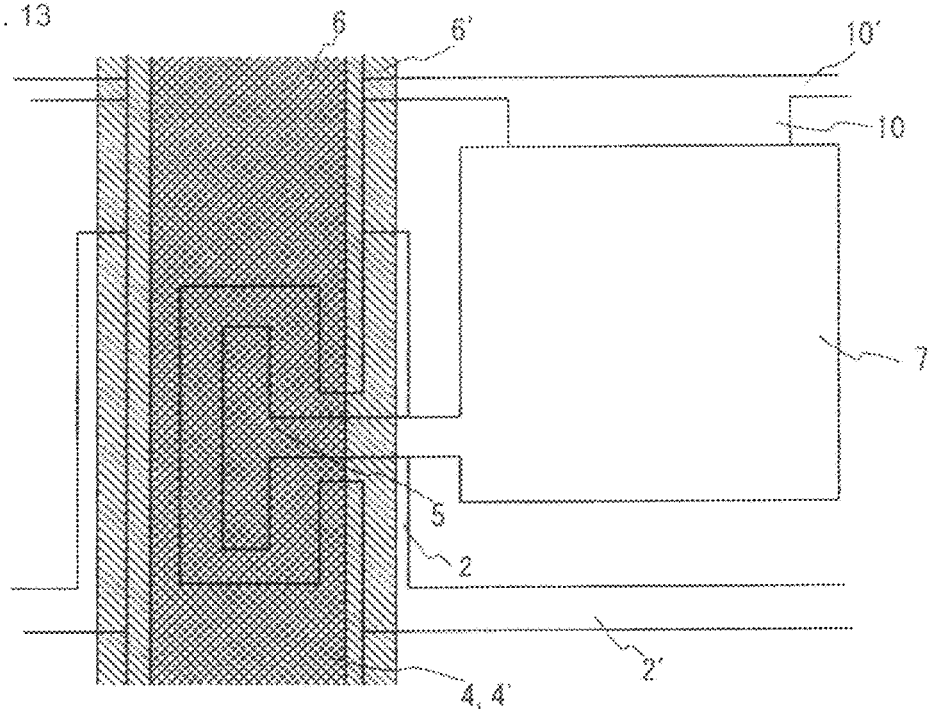
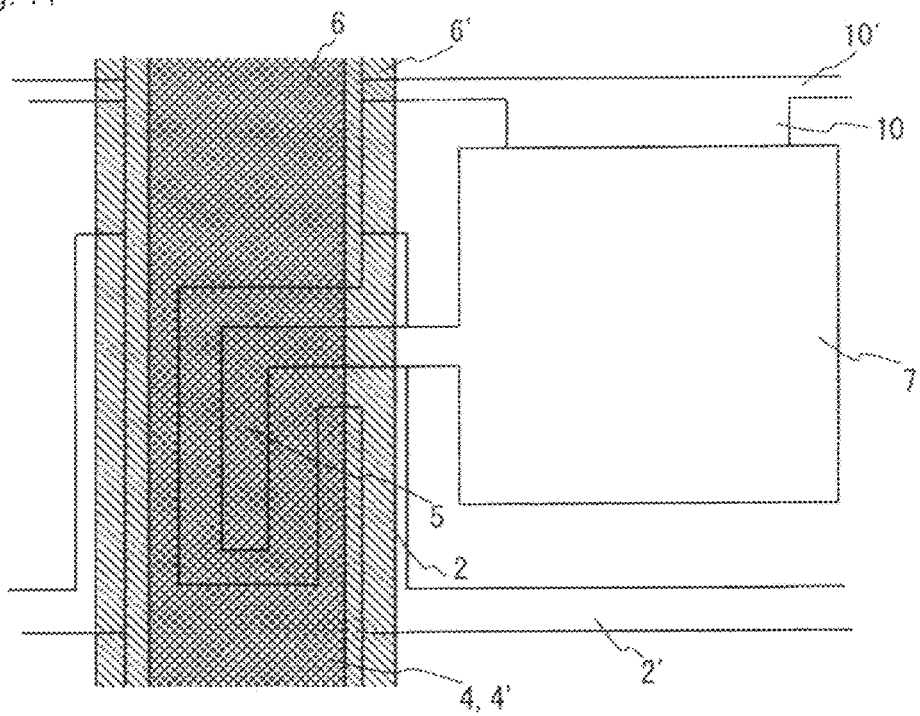

THIN FILM TRANSISTOR ARRAY

CROSS-REFERENCE TO RELATED APPLICATIONS

The present application is a continuation of International Application No. PCT/JP2014/001300, filed Mar. 7, 2014, which is based upon and claims the benefits of priority to Japanese Application No. 2013-059410, filed Mar. 22, 2013. The entire contents of these applications are incorporated herein by reference.

BACKGROUND OF THE INVENTION

Field of the Invention

The present invention relates to thin film transistor arrays, more particularly to a thin film transistor array suitable for a flexible substrate and a printing method.

Discussion of the Background

Thin film transistor (TFT) arrays including amorphous silicon (a-Si) and poly silicon (Poly-Si) provided on a glass substrate have been manufactured based on integrated circuit technique and transistors by using semiconductor substrate. The thin film transistor has been applied to liquid crystal display devices or electrophoretic display devices (non-patent literature 1). As a TFT, for example, a configuration as shown in FIG. 11 is employed (In FIG. 11, a shape of the semiconductor is not clearly illustrated). The TFT serves as a switch such that a signal voltage applied at a source wiring 4' is written into a pixel electrode 7 connected to a drain 5 when the TFT turns ON due to a selection voltage being applied at a gate wiring 2'. The voltage written is held at a storage capacitor constituted by the pixel electrode 7, a gate insulation layer and a capacitor electrode 10. The gate insulation layer is located at an upper layer side from a gate electrode 2, a gate wiring 2' and a capacitor wiring 10' and located at a lower layer side from a source electrode 4, the source wiring 4', a drain electrode 5, the pixel electrode 7 and a semiconductor pattern which is not shown. At the capacitor electrode 10, voltage is applied via the capacitor wiring 10'. In a case of TFT arrays, since the source or drain function of the electrode changes depending on the polarity of the writing voltage, the electrode name of either source or drain cannot be determined only based on the feature of operation. Hence, conveniently, one side is called a source and the other side is called a drain independently of the function. According to the present invention, a side connected to the wiring is called a source and the other side is called a drain.

PTL 1: International Publication Number 2010/107027
NPL 1: Shoichi Matsumoto: "Liquid Crystal Display Technology: Active Matrix LCDs" Sangyo Tosho, published on November 1996, Page 55

SUMMARY OF THE INVENTION

According to one aspect of the present invention, a thin film transistor array includes a gate electrode, a gate wiring connected to the gate electrode and extended in a first direction, a source electrode, a source wiring connected to the source electrode, a drain electrode having a gap from the source electrode in an area overlapped with the gate electrode in a planar view, a semiconductor pattern formed at gate electrode in a planar view, a semiconductor pattern formed at least in a portion corresponding to the gap between the source electrode and the drain electrode, the semiconductor pattern having a region defined by extending the portion in a second direction perpendicular to the first direction, a capacitor electrode, and a pixel electrode connected to the drain electrode such that the pixel electrode overlaps with the capacitor electrode in the planar view. In the planar view, the drain electrode has a shape of a single line, the source electrode has a first portion in a line shape and a second portion in a sheath shape surrounding the drain electrode and keeping a space from the drain electrode, and the source wiring has a width narrower than a width of the region of the semiconductor pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 13 is a planar view showing a third configuration example of a conventional thin film transistor array;

FIG. 14 is a planar view showing a fourth configuration example of a conventional thin film transistor array;

DESCRIPTION OF THE EMBODIMENTS

Figure 1A:
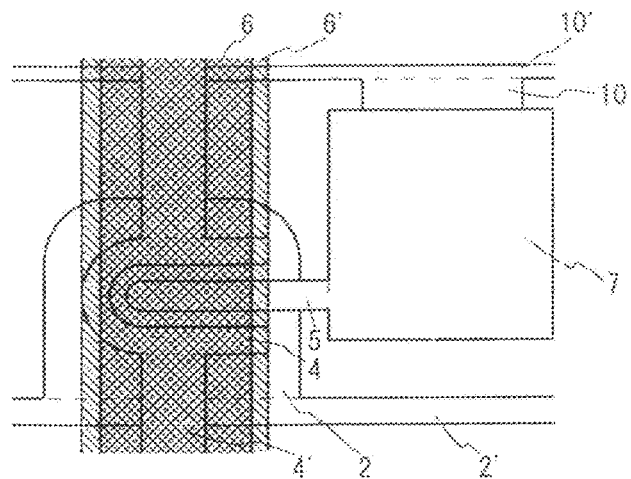
FIGS. 1(a)-1(c) are planar views showing an example of a configuration of a thin film transistor array according to the first embodiment of the present invention.

The embodiments will now be described with reference to the accompanying drawings, wherein like reference numerals designate corresponding or identical elements throughout the various drawings.

Hereinafter, with reference to the drawings, embodiments of the present invention will now be described in detail. In the drawings used in the following, for simplicity of explanation, the scale is not shown accurately.

First Embodiment

Figure 1B:
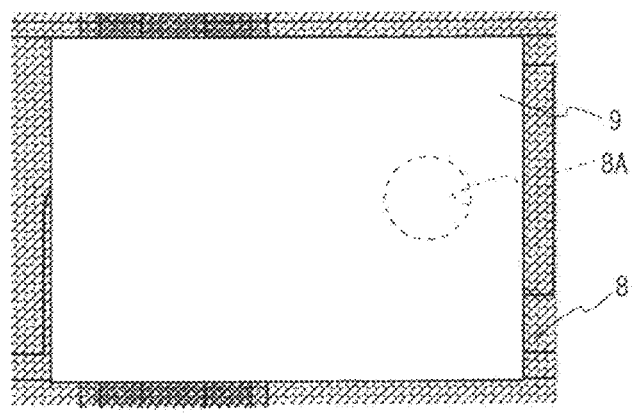
Figure 1C:
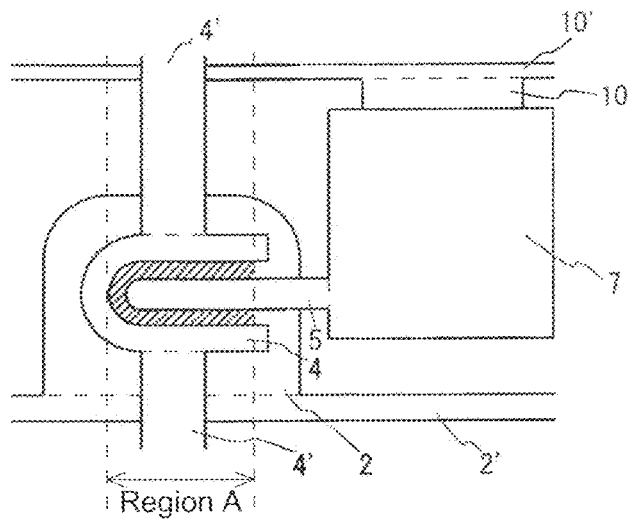

FIGS. 1(a)-1(c) are examples of a configuration of a thin film transistor array according to the first embodiment of the present invention. FIG. 1 (a) is a planar view showing a single pixel (a thin film transistor) of the thin film transistor array in which an interlayer insulation film 8 and an upper pixel electrode 9 are not provided. FIG. 1 (b) is a planar view showing a single pixel of the thin film transistor array having an interlayer insulation film 8 and an upper pixel electrode 9 on the thin film transistor array of FIG. 1 (a). FIG. 1(c) is an explanatory diagram of a single pixel showing a channel and a region A, a gate electrode 2 and a gate wiring 2, a capacitor electrode 10 and a capacitor wiring 10, a source electrode 4 and a source wiring 4, and a drain electrode 5 and a pixel electrode 7. As shown in FIGS. 1(a)-1(c), the thin film transistor array according to the present embodiment includes, on an insulation substrate 1 (refer to FIG. 3 (a)), in the order of lower layer to upper layer, the gate electrode 2 and the gate wiring 2' connected to the gate electrode 2 and also the capacitor electrode 10 and the capacitor electrode wiring 10' connected to the capacitor electrode 10, the gate insulation film 3 (refer to FIG. 3 (b)), the source electrode 4 and the drain electrode 5, having a gap in an area overlapped with the gate electrode 2 when viewing from the above. The thin film transistor array includes a semiconductor pattern 6 at least in the gap formed between the source electrode 4 and the drain electrode 5 in planar view (when viewing in a direction perpendicular to the substrate surface) and a protection layer 6' to cover above the semiconductor pattern 6. The source electrode 4 is connected to the source wiring 4, the drain electrode 5 is connected to the pixel electrode 7 and the pixel electrode 7 is overlapped with the capacitor electrode 10 in planar view. In FIG. 1 (b), an interlayer insulation film 8 having a hole 8A on the pixel electrode 7 and an upper pixel electrode 9 connected to the pixel electrode 7 via the hole 8A are further included. According to the thin film transistor array, in planar view, the drain electrode 5 has a single linear shape having fixed width, the source electrode 4 has a linear shape and also a sheath shape surrounding the drain electrode 5 with a constant interval apart from the drain electrode 5 (refer to FIG. 1 (c)), the source wiring 4' is formed to connect between a plurality of source electrodes 4. The source wiring 4' is narrower than a width of a region A. The region A is a region where a portion in the semiconductor pattern 6, formed at the gap between the source electrode 4 and the drain electrode 5 on the gate electrode 2, is extended in a direction perpendicular to an extending direction of the gate wiring 2' (refer to FIG. 1 (c)). Since the source wiring 4' is narrow, an overlapped area between the gate and the source, and an overlapped area between the source and the upper pixel electrode can be small and the gate-source capacitance and the source-pixel capacitance can be small.

The gate-source capacitance is small, and thus the power consumption due to a charge/discharge of the gate-source capacitance can be lowered. Moreover, since the source-pixel capacitance is small, a source-line coupling where a change in the source-voltage influences the pixel voltage can be lowered, thereby increasing the display quality. Meanwhile, with this shape of the drain electrode 5, if the channel is disposed within the source wiring 4, the width of the source wiring 4' becomes wider so that the gate-source capacitance and the source-pixel electrode becomes larger.

In FIGS. 1(a)-1(c), the drain electrode 5 has a single linear shape and the tip end portion has a round shape. The sheath shape of the source electrode 4 that surrounds it is a curved shape extending along the round shape of the tip end portion of the drain electrode 5. The drain electrode 5 is formed to have a single linear shape. Hence, in the drain electrode 5, a portion that overlaps with the gate electrode 2 without forming a channel, i.e., a portion for supplying power to the channel only requires a single line so that the gate-drain capacitance (i.e., gate-pixel capacitance) becomes small. Hence, so called gate feed-through where a voltage change when the gate voltage turns OFF from the ON state influences the voltage of pixel electrode, can be small, and thus the display quality improves. Also, since the drain electrode 5 and the source electrode 4 in the channel do not have an angle portion having an interior angle less than 180 degrees, current concentration does not occur so that degradation of the source electrode 4, the drain electrode 5 and the semiconductor pattern 6 can be avoided. According to the first embodiment, a semiconductor having high mobility is suitable because the channel width cannot be set so large.

Here, in the semiconductor pattern 6, a portion formed at a gap between the source electrode 4 and the drain electrode 5 on the gate electrode 2 is referred to as a channel where controlled current flows. A region in which the channel is extended in a direction perpendicular to an extending direction of the gate wiring 2' is referred to the region A (FIG. 1 (c)). The distance between the source electrode 4 and the drain electrode 5 is a length in which the controlled current flows and is referred to as a channel length. A width (channel width) in which the controlled current flows is a channel dimension in a direction perpendicular to a direction where the controlled current flows, which can be regarded as a length of the center line between the source electrode 4 and the drain electrode 5.

The source wiring 4' is disposed within the above-described region A. Thus, the source wiring 4' and the source electrode 4 are substantially aligned in a linear line as a whole. Hence, stress applied to the source wiring 4' when forming the source wiring 4, the source electrode 4, the drain electrode 5 and the pixel electrode 7 can be lowered. Accordingly, breakage of the source wiring 4' seldom occurs. Further, in FIG. 1 (c), an angle portion having an interior angle more than or equal to 180 degrees is formed at a portion where the source wiring 4' is connected to the source electrode 4, when viewing the source wiring 4' and the source electrode 4 as a whole body. However, this portion may have a curved shape or chamfering. Thus, wire breakage is further suppressed.

The semiconductor pattern 6 may be formed to connect at least the gap between the source electrode 4 and the drain electrode 5 and may be formed on an upper layer of the source electrode 4 and the drain electrode 5 or under the lower layer of the source electrode 4 and the drain electrode 5. Further, the protection layer 6' may be formed to cover above the semiconductor pattern 6. That is, the semiconductor pattern 6 may be formed on the source electrode 4 and the drain electrode 5 and the protection layer 6' may be formed thereon, or the source electrode 4 and the drain electrode 5 may be formed on the semiconductor pattern 6 and the protection layer 6' may be formed thereon. The protection layer 6' prevents the semiconductor pattern 6 from suffering damage due to the air outside or material of the interlayer insulation film 8.

In FIGS. 1(a)-1(c), the semiconductor pattern 6 has a stripe shape extending over a plurality of pixels in a direction along the source wirings 4'. According to this, the semiconductor layer 6 may readily be formed and aligned. Since the pattern is simple, patterning can be produced easily and alignment displacement in a direction along the source wiring 4' does not cause any problem. Accordingly, alignment can readily be performed.

Moreover, an edge of the semiconductor pattern 6 intersects the drain electrode 5 and also vicinity of the tip end portion of the opening in the sheath shape of the source electrode 4 that surrounds the drain electrode 5. Therefore, the functionality of the semiconductor can be isolated into the channel and other portions by the source electrode 4. Accordingly, uncontrolled current flowing via the semiconductor outside the channel can be prevented from flowing into the drain electrode 5.

Further, the protection layer 6' has a stripe shape extending over a plurality of pixels in a direction along the source wiring 4'. Thus, the protection layer 6' may readily be formed and aligned. Since the pattern is simple, patterning can be performed easily and is not influenced by alignment displacement in a direction along the source wiring 4'. Accordingly, alignment can readily be performed.

Figure 9A:
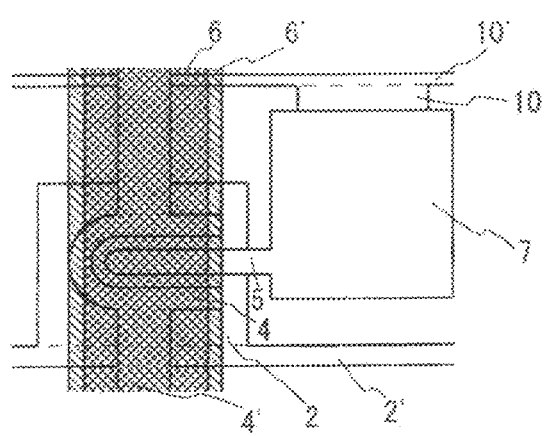
FIGS. 9(a) and 9(b) are planar views showing a configuration example of a thin film transistor array of which the gate electrode is quadrangle, manufactured by a manufacturing method as shown in FIGS. 3(a)-3(g)
Figure 9B:
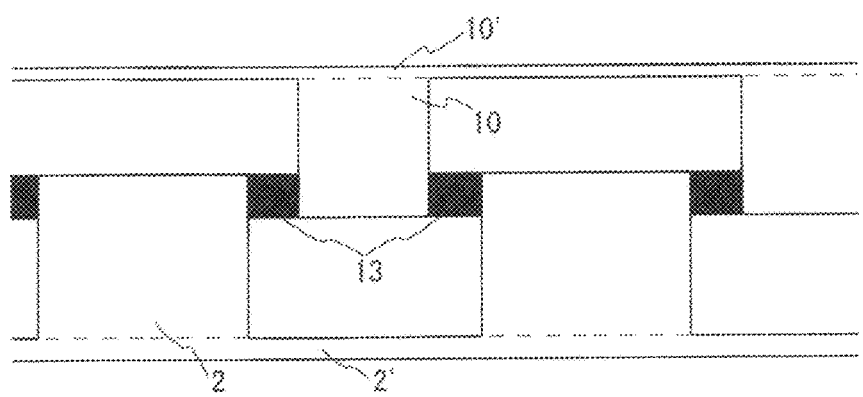

Also, the gate electrode 2 is not formed in a quadrangle, but in a curved shape or a polygon having obtuse angles in which the angle portion of the quadrangle is removed to be along the curved line of the source electrode 4 (refer to FIG. 1 (c)). According to this, the interval between the gate electrode 2 and the capacitor electrode 10 or the capacitor wiring 10' can be wide so that short-circuit between the gate and the source can be avoided. A planar view of one pixel electrode when the gate electrode 2 is a quadrangle is shown in FIG. 9 (a) and a planar view of the gate electrode 2, the gate wiring 2', the capacitor electrode 10 and the capacitor wiring 10' for two pixels is shown in FIG. 9 (b). In this case, at a portion 13 where the distance between the gate and the capacitor is small, short-circuit tends to occur due to the influence of foreign substances in a resist or an ink (FIG. 9 (b)).

As shown in FIG. 1(a), when the interlayer insulation film 8 and the upper pixel electrode 9 are not provided, there are advantages that the structure is simple and the manufacturing is easy. As shown in FIG. 1(b), when the interlayer insulation film 8 and the upper pixel electrode 9 are provided, there is an advantage that the effective area can be expanded up to an area of the upper pixel electrode 9.

Figure 2A:
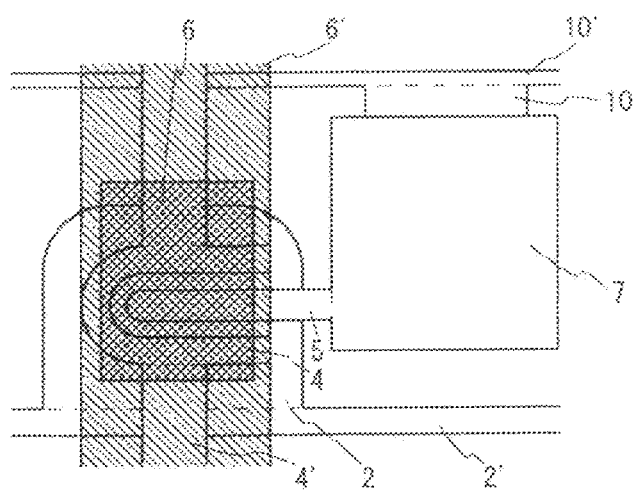
FIGS. 2(a)-2(c) are planar views showing a modification example of a configuration of the thin film transistor array according to the first embodiment of the present invention.
Figure 2B:
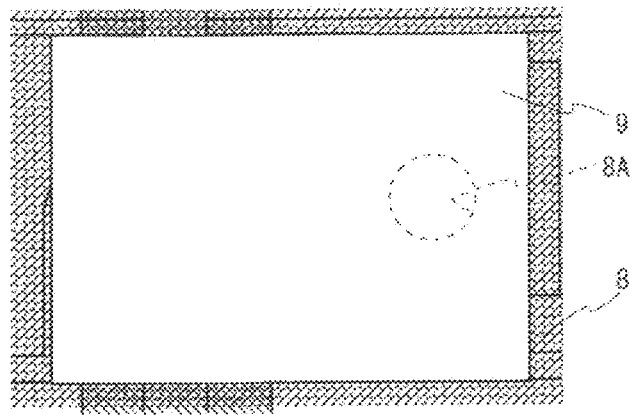
Figure 2C:
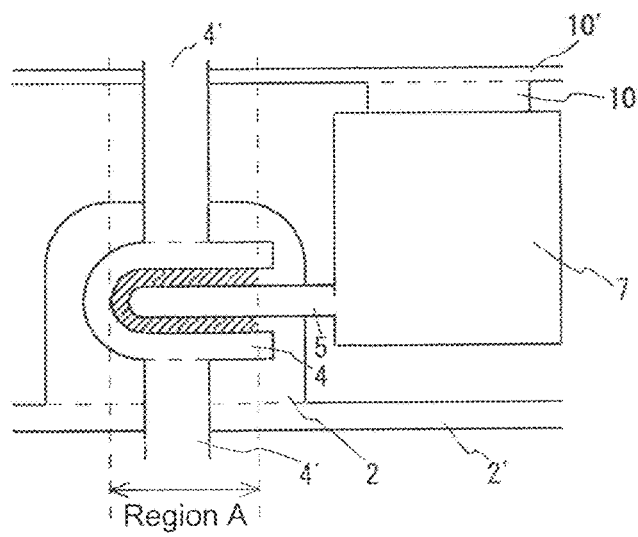

A modification of a configuration of the thin film transistor array according to the first embodiment of the present invention is shown in FIGS. 2(a)-2(c). FIG. 2 (a) is a planar view showing a single pixel of the thin film transistor array in which the interlayer insulation layer 8 and the upper pixel electrode 9 are not provided, FIG. 2 (b) is a planar view showing a single pixel of the thin film transistor array in which the interlayer insulation layer 8 and the upper pixel electrode 9 are provided on the configuration as shown in FIG. 2 (a), FIG. 2 (c) is an explanatory diagram of a single pixel showing the channel and the region A, the gate electrode 2 and the gate wiring 2, the capacitor electrode 10 and the capacitor wiring 10', the source electrode 4 and the source wiring 4' and the drain electrode 5 and the pixel electrode 7. In FIGS. 2(a)-2(c), the shape of the semiconductor is a rectangle. However, the semiconductor is independent of each pixel. In this case, a margin that allows for alignment displacement in a direction along the source wiring during printing is smaller than that of a case where the stripe shape extending over a plurality of thin film transistors is employed. However, the amount of semiconductors used can be reduced.

An example of a manufacturing method of the thin film transistor array according to the present embodiment as shown in FIGS. 1(a)-2(c) is shown in FIGS. 3(a)-3(g). The gate electrode 2 and the gate wiring 2, the capacitor electrode 10 and the capacitor wiring 10' are formed on the insulation substrate 1 (FIG. 3 (b)). Next, the gate insulation film 3 is formed thereon (as shown in FIG. 3 (b) by a hatching area of vertical lines, after FIG. 3 (c), illustration is omitted). Further, the source electrode 4 and the source wiring 4, the drain electrode 5 and the pixel electrode 7 are formed (FIG. 3 (c)). At this time, the drain electrode 5 has a single linear shape having fixed width, the source electrode 4 has a linear shape and also a sheath shape surrounding the drain electrode 5 with a constant interval apart from the drain electrode 5 and the source wiring 4' is formed to connect between a plurality of source electrodes 4. The source wiring 4' is within a region A where the semiconductor pattern 6, at a gap between the gate electrode 2 and the source electrode 4, is extended in a direction perpendicular to an extending direction of the gate wiring 2, and the source wiring 4' is printed by using a plate having a shape narrower than the width of the region A. The tip end portion of the drain electrode 5 has a round shape and the tip end portion of the sheath shape of the source electrode 4 has a curved shape extending around the round shape of the tip end portion of the drain electrode 5. The semiconductor pattern 6 is formed at least between the source electrode 4 and the drain electrode 5 (FIG. 3 (d)). The semiconductor pattern 6 may be formed independently belong to each transistor as shown in FIGS. 2(a)-2(c). However, the semiconductor pattern 6 may preferably be formed in a stripe shape extending over a plurality of thin film transistors in a direction along the source wiring 4' as shown in FIGS. 1(a)-1(c). Also, an edge of the semiconductor pattern 6 may preferably intersect the drain electrode 5 and the vicinity of the tip end portion of the opening in the sheath shape of the source electrode 4 that surrounds the drain electrode 5. Subsequently, the protection layer 6' that covers the semiconductor pattern 6 is formed (FIG. 3 (e)). The protection layer 6' may preferably be formed in a stripe shape extending over a plurality of thin film transistors in a direction along the source wiring 4'.

Afterward, a manufacturing step where the interlayer insulation film 8 having the hole 8A on the pixel electrode 7 (FIG. 3 (f)) is formed and a manufacturing step where the upper pixel electrode 9 connected to the pixel electrode 8 via the hole 8a is formed thereon (FIG. 3 (g)) may be included.

Figure 3A:
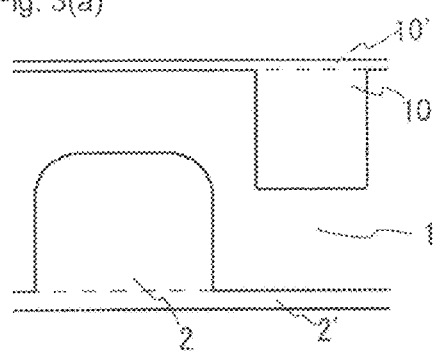
FIGS. 3(a)-3(g) are planar views showing an example of a manufacturing method of the thin film transistor array according to the first embodiment of the present invention.
Figure 3E:
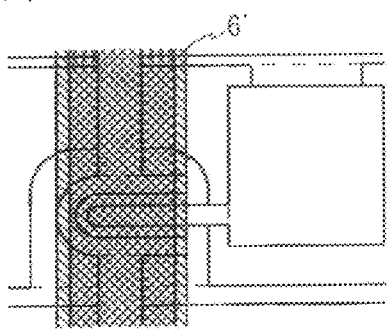
Figure 3B:
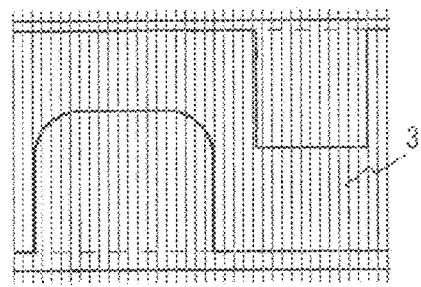
Figure 3F:
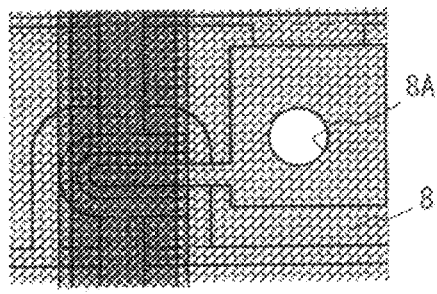
Figure 3C:
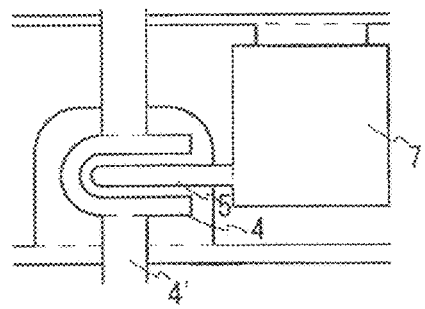
Figure 3G:
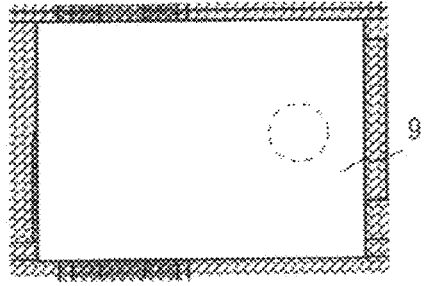
Figure 3D:
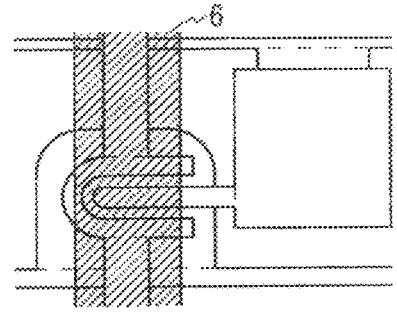

Further, in a manufacturing step for forming the gate electrode 2, the gate wiring 2, the capacitor electrode 10 and the capacitor wiring 10' (FIG. 3(a)), the gate electrode 2 may preferably be formed not in a rectangular shape but in a curved shape or a polygonal shape along the curved shape of the source electrode 4.

As the insulation substrate 1, a rigid substrate such as a glass substrate may be used or a flexible substrate made of such as polyethylene terephthalate (PET), polyethylene naphthalate (PEN), polyimide (PI), polyether imide (PEI) or polyether sulfone (PES) may be used.

As the gate electrode 2, the gate wiring 2, the capacitor electrode 10 and the capacitor wiring 10, a metal such as Al, Ag, Cu, Cr, Ni, Mo, Au, Pt, or a conductive oxide such as ITO, or carbon, or a conductive polymer can be employed. As a manufacturing method, ink may be printed and fired to become the electrodes and wirings, or the electrodes and wirings may be formed by photolithography, etching and stripping resist after forming a film on the whole surface. Alternatively, after film-forming the whole surface, the gate electrode 2, the gate wiring 2, the capacitor electrode 10 and the capacitor wiring 10' may be formed by resist printing, etching and resist stripping.

As the insulation layer 3, an inorganic substance such as $SiO_2$, SiON or SiN, or an organic substance such as polyvinyl phenol (PVP), epoxy or the like may be employed. As a manufacturing method, vacuum film forming such as sputtering or CVD, or coating with a solution and firing can be employed.

As the source electrode 4, the source wiring 4, the drain electrode 5 and the pixel electrode 7, metal such as Ag, Cu, Cr, Ni, Mo, Au, Pt, Al or the like, a conductive oxide such as ITO, carbon, or conductive polymer can be employed. As a manufacturing method, the electrodes and wirings may be formed by photolithography, etching and resist stripping after the whole surface is film-formed. However, ink may preferably be printed and firing may be applied to obtain the above-described electrodes and wirings. As a printing method, screen printing, gravure printing, flexographic printing, or offset printing may preferably be used. Specifically, by gravure printing, flexographic printing and offset printing, a pattern less than 20 μm can be formed with excellent repeatability.

As the semiconductor pattern 6, an organic semiconductor such as polythiophene system, acene system or allylamine system, and an oxide semiconductor such as $In_2O_3$ system, $Ga_2O_3$ system, ZnO system, $SnO_2$ system, InGaZnO system, InGaSnO system or InSnZnO system can be used. As a manufacturing method, a method in which solution is printed by such as ink jet, dispenser, flexographic printing and fired may preferably be used.

As the protection layer 6, fluorine resin or silicone-based resin can be used. As a manufacturing method, a method in which a solution is printed by such as an ink jet, dispenser, or flexographic printing and fired may preferably be used.

As the interlayer insulation film 8, an organic insulation film such as epoxy may preferably be used. As a manufacturing step, a screen printing or gravure-offset printing may preferably be used.

As the upper pixel electrode 9, Ag paste or the like may preferably be used. As a manufacturing step, screen printing or gravure-offset printing may preferably be used.

The order of the manufacturing step for forming the source electrode 4, the source wiring 4', the drain electrode 5 and the pixel electrode 7, and the manufacturing step for forming the semiconductor pattern 6 can be reversed.

Second Embodiment

Figure 4A:
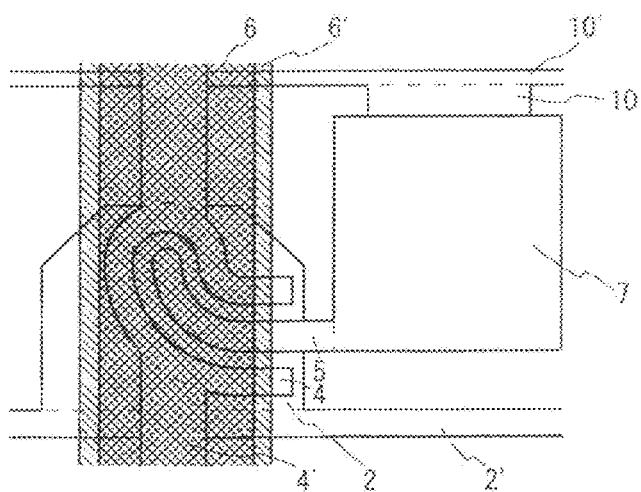
FIGS. 4(a)-4(c) are planar views showing an example of configuration of a thin film transistor array according to the second embodiment of the present invention.
Figure 4B:
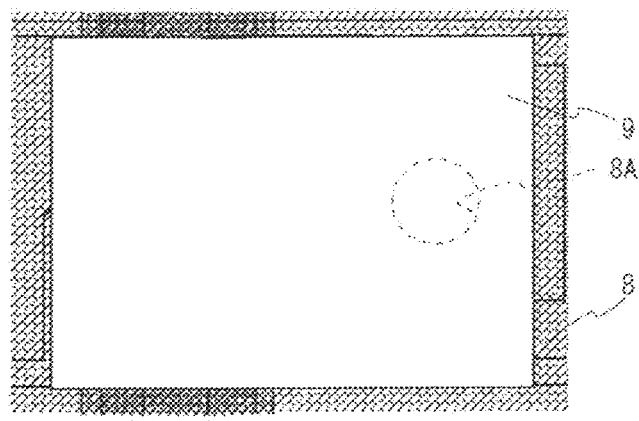
Figure 4C:
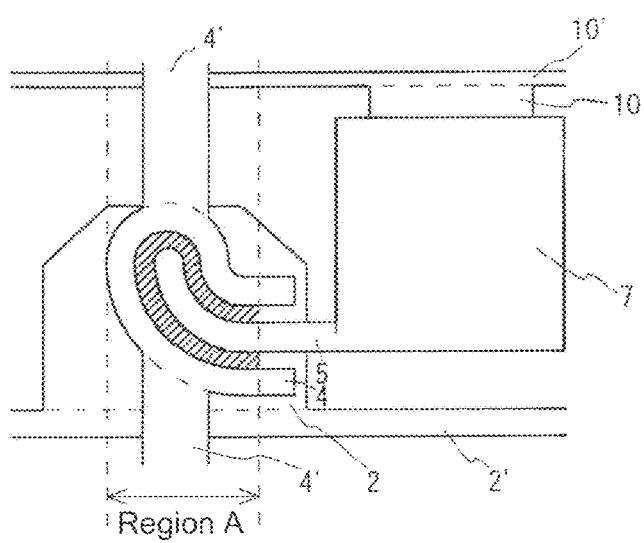

An example of the thin film transistor array according to the second embodiment of the present invention is shown in FIGS. 4(a)-4(c). FIG. 4 (a) is a planar view showing a single pixel of a thin film transistor array in which the interlayer insulation film 8 and the upper pixel electrode 9 are not provided. FIG. 4 (b) is a planar view showing a single pixel of the thin film transistor array in which the interlayer insulation layer 8 and the upper pixel electrode 9 are provided, FIG. 4 (c) is an explanatory diagram of a single pixel showing the channel and the region A, the gate electrode 2 and the gate wiring 2, the capacitor electrode 10 and the capacitor wiring 10, the source electrode 4 and the source wiring 4' and the drain electrode 5 and the pixel electrode 7. As shown in FIGS. 4(a)-4(c), the thin film transistor array according to the present embodiment includes, on an insulation substrate 1 (refer to FIG. 6 (a)), in the order of lower layer to upper layer, the gate electrode 2 and the gate wiring 2' connected to the gate electrode 2, the capacitor electrode 10 and the capacitor wiring 10' connected to the capacitor electrode 10, the gate insulation film 3, the source electrode 4 and the drain electrode 5 between which a gap exists in an area overlapped with the gate electrode 2 in planar view. The thin film transistor array includes a semiconductor pattern 6 at least in the gap formed between the source electrode 4 and the drain electrode 5, and includes a protection layer 6' to cover above the semiconductor pattern 6. The source electrode 4 is connected to the source wiring 4', the drain electrode 5 is connected to the pixel electrode 7 and the pixel electrode 7 is overlapped with the capacitor electrode 10 in planar view. In FIG. 4 (b), an interlayer insulation film 8 having a hole 8A on the pixel electrode 7 and an upper pixel electrode 9 connected to the pixel electrode 7 via the hole 8A are further included. According to the thin film transistor array, in planar view, the drain electrode 5 has a single linear shape having fixed width, the source electrode 4 has a linear shape and also a sheath shape surrounding the drain electrode 5 with a constant interval apart from the drain electrode 5 (refer to FIG. 4 (c)), and the source wiring 4' is formed to connect between a plurality of source electrodes 4. The source wiring 4' is narrower than the width of region A. The region A is a region where a portion of the semiconductor pattern 6, formed at a gap between the source electrode 4 and the drain electrode 5 above the gate electrode 2, is extended in a direction perpendicular to an extending direction of the gate wiring 2' (refer to FIG. 4 (c)). Since the source wiring 4' is narrow, an overlapped area between the gate and the source, and an overlapped area between the source and the upper pixel electrode can be small and the gate-source capacitance and the source-pixel capacitance can be small.

The gate-source capacitance is small, then the power consumption due to a charge/discharge of the gate-source capacitance can be lowered. Moreover, since the source-pixel capacitance is small, source-line coupling where a change in the source-voltage influences the pixel voltage can be lowered, then the display quality is improved. Meanwhile, with this shape of the drain electrode 5, if the channel is disposed within the source wiring 4, the width of the source wiring 4' becomes wider so that the gate-source capacitance and the source-pixel electrode becomes larger.

As shown in FIGS. 4(a)-4(c), in planar view, the drain electrode 5 is a single line extended bending from a direction parallel to an extending direction of the gate wiring 2, towards a direction parallel to an extending direction of the source wiring 4' and the tip end portion thereof has a round shape. The sheath shape of the source electrode 4 that surrounds the drain electrode 5 has a curved shape around the curves of an extending direction of the drain electrode 5 and the round shape of the tip end portion. The drain electrode 5 is formed to have single lineshape. Hence, in the drain electrode 5, a portion that overlaps with the gate electrode 2 without forming a channel, i.e., a portion for supplying power to the channel only requires a single line so that the gate-drain capacitance (i.e., gate-pixel capacitance) becomes small. Hence, so called gate feed-through where a voltage change when the gate voltage turns OFF from the ON state influences the voltage of pixel electrode can be small, then the display quality improves. Moreover, the drain electrode 5 and the source electrode 4 do not have an angle portion so that current concentration does not occur. Accordingly, degradation of the source electrode 4, the drain electrode 5 and the semiconductor pattern 6 is avoided. In FIGS. 4(a)-4(c), the drain electrode 5 extends changing from a linear portion which is parallel to the extending direction of the gate wiring 2' to a curved portion. However, the drain electrode 5 may further extend linearly to a direction parallel to the extending direction of the source electrode 4' from the curved portion. The second embodiment has a feature that the channel width can be wide in the narrow region A even though the drain electrode 5 does not have an angle portion in which the interior angle is less than 180 degrees.

Here, in the semiconductor pattern 6, a portion formed at a gap between the source electrode 4 and the drain electrode 5 above the gate electrode 2 is referred to a channel where controlled current flows. A region in which the channel is extended in a direction perpendicular to an extending direction of the gate wiring 2' is referred to the region A (FIG. 4 (c)). The distance between the source electrode 4 and the drain electrode 5 is a length in which the controlled current flows and referred to a channel length. A width (channel width) in which the controlled current flows is a channel dimension in a direction perpendicular to a direction where the controlled current flows, which can be regarded as a length of the center line between the source electrode 4 and the drain electrode 5.

The source wiring 4' is within the above-described region A. Thus, the source wiring 4' and the source electrode 4 are substantially aligned in a linear line as a whole. Hence, stress applied to the source wiring 4' when forming the source wiring 4', the source electrode 4, the drain electrode 5 and the pixel electrode 7 can be lowered. Accordingly, breakage of the source wiring 4' seldom occurs. Further, in FIG. 4 (c), an angle portion having an interior angle more than or equal to 180 degrees is formed at a portion where the source wiring 4' is connected to the source electrode 4, when viewing the source wiring 4' and the source electrode 4 as a whole body. However, this portion may be a curved shape or have chamfering. Thus, wire breakage is further suppressed.

Figure 7A:
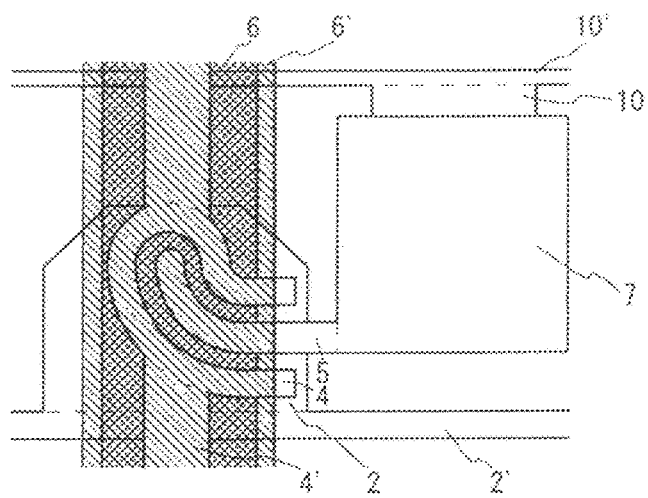
FIGS. 7(a)-7(c) are planar views showing another modification example of a configuration of the thin film transistor array according to the second embodiment of the present invention.

The semiconductor pattern 6 may be formed to connect at least the gap between the source electrode 4 and the drain electrode 5 and may be formed on an upper layer side (FIG. 4 (a)) of the source electrode 4 and the drain electrode 5 or under the lower layer side (FIG. 7(a)) of the source electrode 4 and the drain electrode 5. Further, the protection layer 6' may be formed to cover above the semiconductor pattern 6. That is, the semiconductor pattern 6 may be formed on the source electrode 4 and the drain electrode 5 and the protection layer 6' may be formed thereon (FIG. 4 (a)), or the source electrode 4 and the drain electrode 5 may be formed on the semiconductor pattern 6 and the protection layer 6' may be formed thereon (FIG. 7(a)). The protection layer 6' prevents the semiconductor pattern 6 from suffering damage due to the air outside or material of the interlayer insulation film 8. The location of the region A is similar even in a case where the semiconductor pattern 6 is located at a layer under the source electrode 4 and the drain electrode 5 (FIG. 7(c)).

In FIGS. 4(a)-4(c), the semiconductor pattern 6 has a stripe shape extending over a plurality of pixels in a direction along the source wirings 4'. According to this, the semiconductor layer 6 may readily be formed and aligned. Since the pattern is simple, patterning can be made easily and is not influenced by alignment displacement in a direction along the source wiring 4'. Accordingly, alignment can readily be performed.

Moreover, an edge of the semiconductor pattern 6 intersects the drain electrode 5 and with the vicinity of a tip end portion of the opening in the sheath shape of the source electrode 4 that surrounds the drain electrode 5. Therefore, the semiconductor function can be divided into the channel and other portions by the source electrode 4. Accordingly, uncontrolled current flowing via the semiconductor outside the channel can be prevented from flowing into the drain electrode 5.

Further, the protection layer 6' has a stripe shape extending over a plurality of pixels in a direction along the source wiring 4'. Thus, the protection layer 6' may readily be formed and aligned. Since the pattern is simple, patterning can be made easily and is not influenced by an alignment displacement in a direction along the source wiring 4'. Accordingly, alignment can readily be performed.

Also, the gate electrode 2 is not formed in a quadrangle, but a curved shape or a polygon having obtuse angles in which the angle portion of the quadrangle is removed to be along the curved line of the source electrode 4 (refer to FIG. 4 (c)). According to this, the interval between the gate electrode 2 and the capacitor electrode 10 or the capacitor wiring 10' can be wide so that short-circuit between the gate and the source can be avoided. A planar view of one pixel electrode when the gate electrode 2 is quadrangle is shown in FIG. 10 (a) and a planar view of the gate electrode 2, the gate wiring 2', the capacitor electrode 10 and the capacitor wiring 10' for two pixels is shown in FIG. 10 (b). In this case, at a portion 13 where the distance between the gate and the capacitor is narrow, short-circuit happens due to influence of foreign substances in a resist or an ink (FIG. 10 (b)).

Figure 7B:
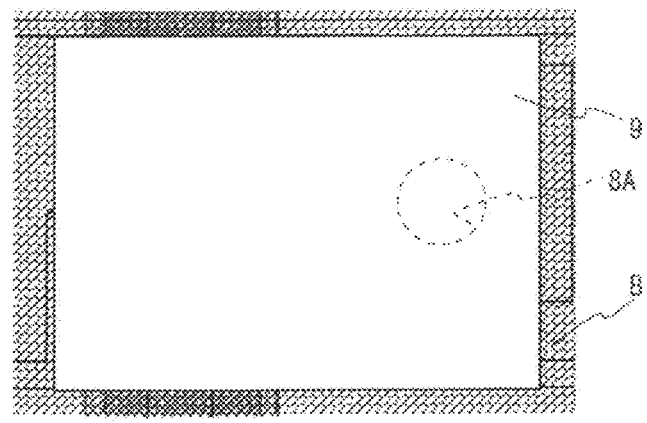
Figure 7C:
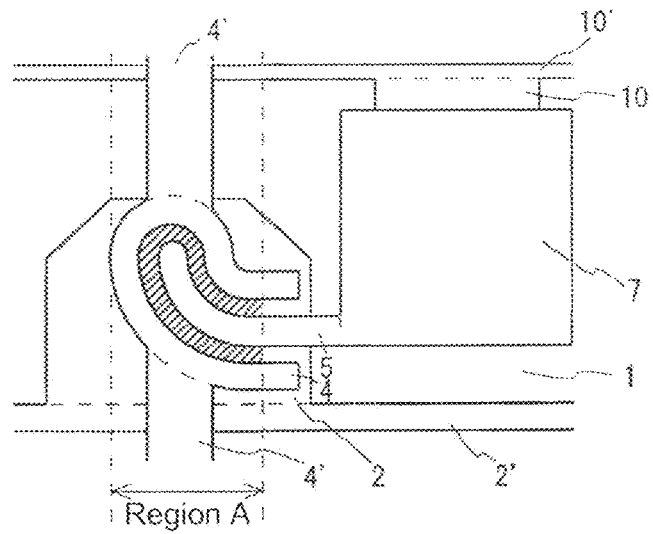
Figure 8A:
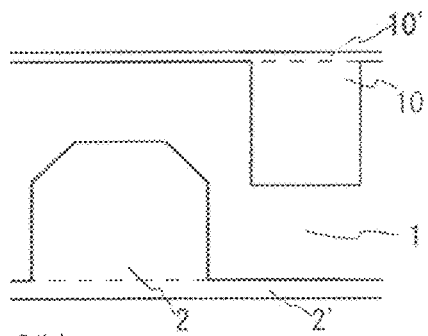
FIGS. 8(a)-8(g) are planar views showing another example of a manufacturing method of the thin film transistor array according to the second embodiment of the present invention.
Figure 8E:
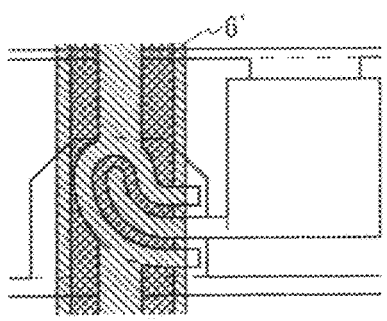
Figure 8B:
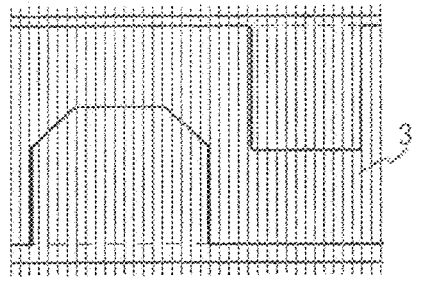
Figure 8F:
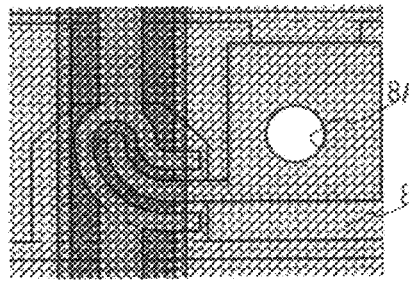
Figure 8C:
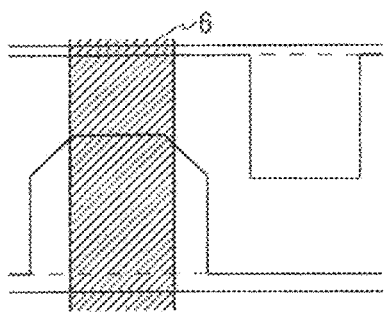
Figure 8G:
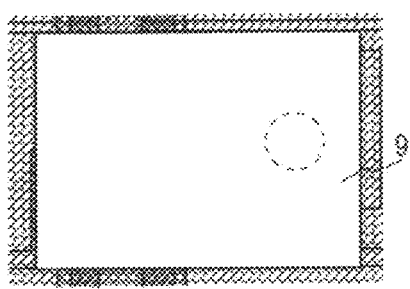
Figure 8D:
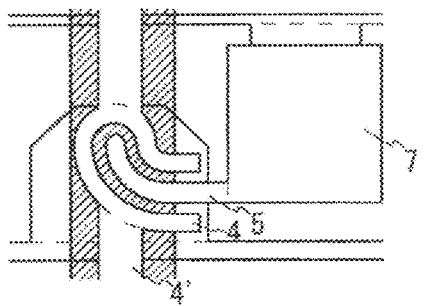

As shown in FIG. 4 (a) and FIG. 7 (a), where the interlayer insulation film 8 and the upper pixel electrode 9 are not provided, there are advantages that the structure is simple and the manufacturing is easy. As shown in FIG. 4 (b) and FIG. 7 (b), the interlayer insulation film 8 and the upper pixel electrode 9 are provided, there is an advantage that the effective area can be expanded up to an area of the upper pixel electrode 9.

Figure 5A:
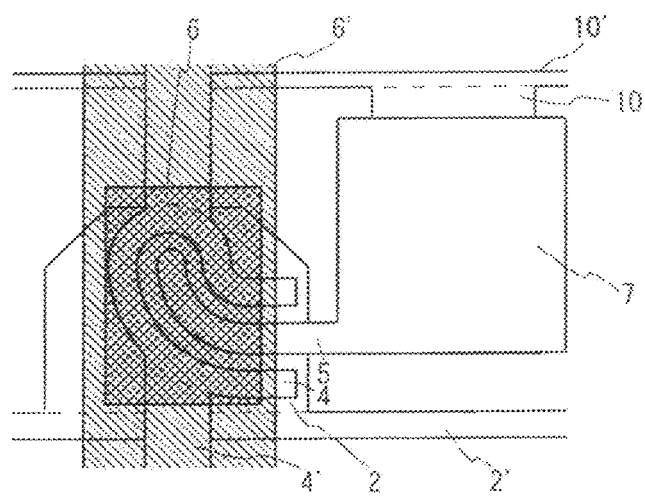
FIGS. 5(a)-5(c) are planar views showing a modification example of a configuration of the thin film transistor array according to the second embodiment of the present invention.
Figure 5B:
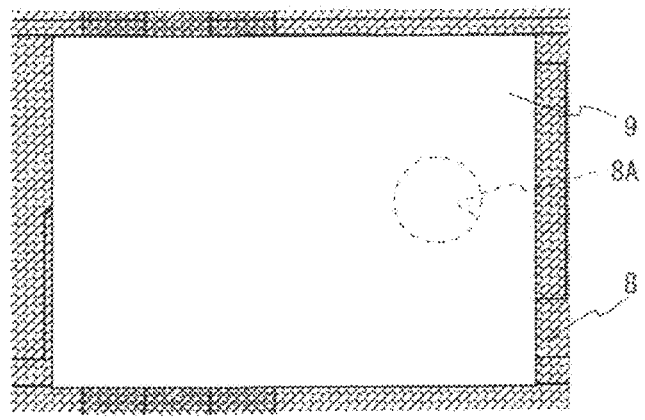
Figure 5C:
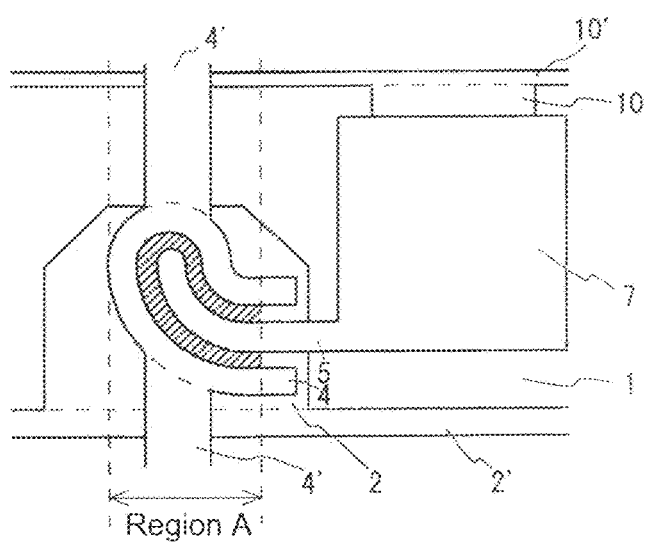

A modification of a configuration of the thin film transistor array according to the second embodiment of the present invention is shown in FIGS. 5(a)-5(c). FIG. 5 (a) is a planar view showing a single pixel of the thin film transistor array in which the interlayer insulation layer 8 and the upper pixel electrode 9 are not provided, FIG. 5 (b) is a planar view showing a single pixel of the thin film transistor array in which the interlayer insulation layer 8 and the upper pixel electrode 9 are provided on that shown in FIG. 5 (a), FIG. 5 (c) is an explanatory diagram of a single pixel showing the channel and the region A, the gate electrode 2 and the gate wiring 2, the capacitor electrode 10 and the capacitor wiring 10, the source electrode 4 and the source wiring 4' and the drain electrode 5 and the pixel electrode 7. In FIGS. 5(a)-5(c), the shape of the semiconductor is a rectangle. However, the semiconductor is independent of the semiconductor of the adjacent pixel. In this case, a margin that allows an alignment displacement in a direction along the source wiring during a printing is smaller than that of a case where the stripe shape extending over a plurality of thin film transistors is employed. However, the amount of semiconductor used can be reduced.

An example of a manufacturing method of the thin film transistor array according to the present embodiment as shown in FIGS. 4 and 5 is shown in FIGS. 6(a)-6(g). The gate electrode 2 and the gate wiring 2, the capacitor electrode 10 and the capacitor wiring 10' are formed on the insulation substrate 1 (FIG. 6 (a)). Next, the gate insulation film 3 is formed thereon (as shown in FIG. 6 (b) by hatching of vertical lines, and after FIG. 6 (c), illustration is omitted). Further, the source electrode 4 and the source wiring 4', the drain electrode 5 and the pixel electrode 7 are formed (FIG. 6 (c)). At this time, the drain electrode 5 has a single lineshape having fixed width, the source electrode 4 has a lineshape and also a sheath shape surrounding the drain electrode 5 with a constant interval away from the drain electrode 5 and the source wiring 4' is formed to connect between a plurality of source electrodes 4. The source wiring 4' is within a region A where a portion of the semiconductor pattern 6, at a gap between the gate electrode 2 and the source electrode 4, is extended in a direction perpendicular to an extending direction of the gate wiring 2' and the source wiring 4' is printed by using a plate having a shape narrower than the width of the region A. The tip end portion of the drain electrode 5 has a round shape and the tip end portion of the sheath shape of the source electrode 4 has a curved shape extending around the round shape of the tip end portion of the drain electrode 5. The semiconductor pattern 6 is formed at least between the source electrode 4 and the drain electrode 5 (FIG. 6 (d)). The semiconductor pattern 6 may be formed independently of the semiconductor pattern of adjacent transistor as shown in FIGS. 5(a)-5(c). However, the semiconductor pattern 6 may preferably be formed in a stripe shape extending over a plurality of thin film transistors in a direction along the source wiring 4' as shown in FIGS. 4(a)-4(c). Also, an edge of the semiconductor pattern 6 may preferably intersect the drain electrode 5 and vicinity of the tip end portion of the opening in the sheath shape of the source electrode 4 that surrounds the drain electrode 5. Moreover, the protection layer 6' that covers the semiconductor pattern 6 is formed (FIG. 6 (e)). The protection layer 6' may preferably be formed in a stripe shape extending over a plurality of thin film transistors in a direction along the source wiring 4'.

Afterward, a manufacturing step where the interlayer insulation film 8 having the hole 8A on the pixel electrode 7 (FIG. 6 (f)) is formed and a manufacturing step where the upper pixel electrode 9 connected to the pixel electrode 8 via the hole 8a is formed thereon (FIG. 6 (g)) may be included.

Figure 6A:
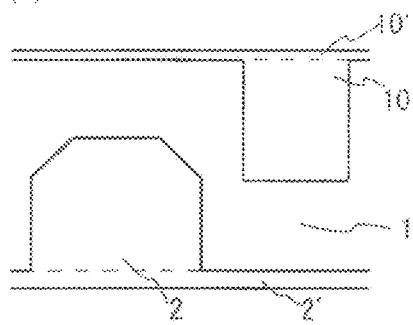
FIGS. 6(a)-6(g) are planar views showing an example of a manufacturing method of the thin film transistor array according to the second embodiment of the present invention.
Figure 6B:
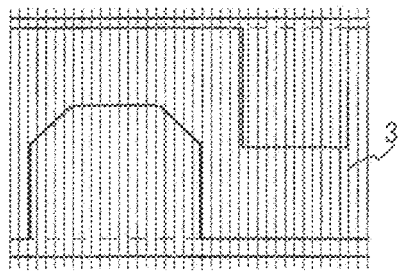
Figure 6C:
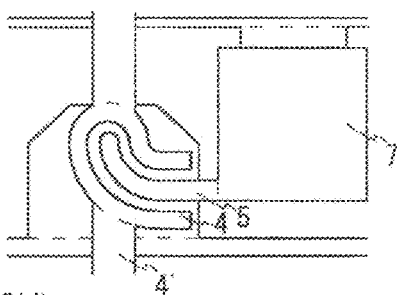
Figure 6D:
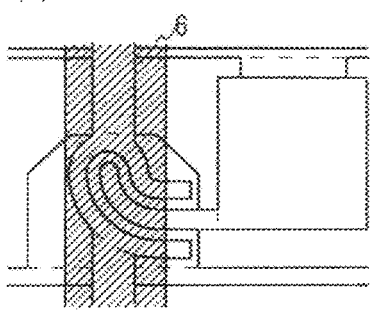
Figure 6E:
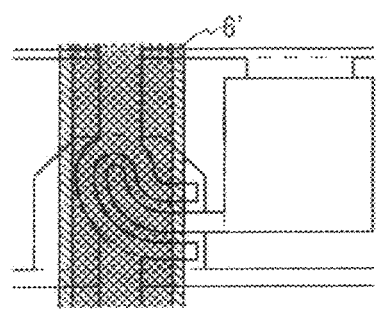
Figure 6F:
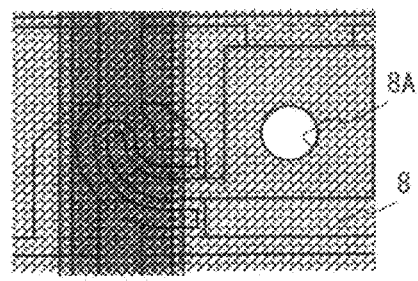
Figure 6G:
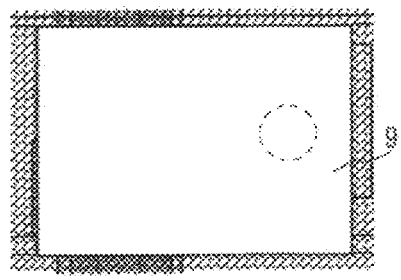

Further, in a manufacturing step for forming the gate electrode 2, the gate wiring 2, the capacitor electrode 10 and the capacitor wiring 10' (FIG. 6(a)), the gate electrode 2 may preferably be formed not in a rectangular shape but in a curved shape or a polygonal shape along the curved shape of the source electrode 4.

As the insulation substrate 1, rigid substrate such as a glass substrate may be used or a flexible substrate made of, for example, polyethylene terephthalate (PET), polyethylene naphthalate (PEN), polyimide (PI), polyether imide (PEI) or polyether sulfone (PES) may be used.

As the gate electrode 2, the gate wiring 2, the capacitor electrode 10 and the capacitor wiring 10, a metal such as Al, Ag, Cu, Cr, Ni, Mo, Au, Pt, or a conductive oxide such as ITO, or carbon, or conductive polymers or the like can be employed. As a manufacturing method, ink may be printed and fired to become the electrodes and wirings, or the electrodes and wirings may be formed by photolithography, etching and resist stripping after the whole surface is film-formed. Alternatively, after film-forming the whole surface, the gate electrode 2, the gate wiring 2', the capacitor electrode 10 and the capacitor wiring 10' may be formed by resist printing, etching and resist stripping.

As the insulation layer 3, an inorganic substance such as $SiO_2$, SiON, or SiN, or an organic substance such as polyvinyl phenol (PVP), epoxy or the like may be employed. As a manufacturing method, vacuum film forming such as sputtering or CVD, or solution-coating and firing can be employed.

As the source electrode 4, the source wiring 4, the drain electrode 5 and the pixel electrode 7, metal such as Ag, Cu, Cr, Ni, Mo, Au, Pt, Al or the like, a conductive oxide such as ITO, carbon, or conductive polymer can be employed. As a manufacturing method, it may be formed by photolithography, etching and a resist stripping after whole surface is film-formed. However, ink may preferably be printed and firing may be applied to obtain the above-described electrodes and wirings. As a printing method, a screen printing, gravure printing, flexographic printing, or offset printing may preferably be used. Specifically, with gravure printing, flexographic printing and offset printing, a pattern less than 20 μm can be formed with excellent repeatability.

As the semiconductor pattern 6, an organic semiconductor such as polythiophene system, acene system or allylamine system, and an oxide semiconductor such as an $In_2O_3$ system, $Ga_2O_3$ system, ZnO system, $SnO_2$ system, InGaZnO system, InGaSnO system, or InSnZnO system can be used. As a manufacturing method, a method in which solution is printed by such as an ink jet, dispenser, or flexographic printing and then fired may preferably be used.

As the protection layer 6, a fluorine resin or silicone-based resin can be used. As a manufacturing method, a method in which a solution is printed by such as ink jet, dispenser, or flexographic printing and then fired may preferably be used.

As the interlayer insulation film 8, an organic insulation film such as epoxy may preferably be used. As a manufacturing step, a screen printing or a gravure-offset printing may preferably be used.

As the upper pixel electrode 9, Ag paste or the like may preferably be used. As a manufacturing step, screen printing or a gravure-offset printing may preferably be used.

The order of the manufacturing step for forming the source electrode 4, the source wiring 4', the drain electrode 5 and the pixel electrode 7, and the manufacturing step for forming the semiconductor pattern 6 can be reversed (FIG. 8 (a) to FIG. 8 (g)). In this case, a top-contact type TFT is produced.

EXAMPLES

Example 1

With reference to FIG. 1 (a) and FIGS. 3(a)-3(g), hereinafter will be described the example 1 according to the present invention. The element as shown in FIG. 1 (a) is produced by manufacturing steps as shown in FIG. 3 (a) to FIG. 3 (e). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching (FIG. 3(a)). Next, a solution of polyvinyl phenol is spin-coated, and fired at 150 degree C., thereby forming polyvinyl phenol as the gate insulation film 3 with thickness of 1 μm (FIG. 3 (b)). Also, as the source electrode 4, the source wiring 4, the drain electrode 5 and the pixel electrode 7, Ag ink is offset-printed, and fired at 180 degree C., thereby forming the pattern (FIG.

3 (*c*)). Moreover, a solution of polythiophene is flexographically printed, and then fired at 100 degree C. so as to form the semiconductor pattern 6 (FIG. 3 (*d*)).

Subsequently, fluororesin is screen-printed and fired at 100 degree C., thereby forming the protection layer 6' (FIG. 3 (*e*)).

An electrophoretic material is disposed between the thin film transistor array produced in this way and a PET substrate having a transparent electrode and predetermined drive-voltage waveforms are applied, whereby excellent display results without any crosstalk are obtained. Also, a display which is resistant to degradation is obtained.

Example 2

With reference to FIG. 1 (*b*) and FIGS. 3(*a*)-3(*g*), hereinafter will be described the example 2 according to the present invention. The element as shown in FIG. 1 (*b*) is produced by manufacturing steps as shown in FIG. 3 (*a*) to FIG. 3 (*g*). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching (FIG. 3(*a*)). Next, a solution of polyvinyl phenol is spin-coated and fired at 150 degree C., thereby forming polyvinyl phenol as the gate insulation film 3 with thickness of 1 µm (FIG. 3 (*b*)). Also, as the source electrode 4, the source wiring 4, the drain electrode 5 and the pixel electrode 7, Ag ink is offset-printed, and fired at 180 degree C., thereby forming the pattern (FIG. 3 (*c*)). Moreover, a solution of polythiophene is flexographically printed, and fired at 100 degree C. so as to form the semiconductor pattern 6 (FIG. 3 (*d*)).

Subsequently, fluororesin is screen-printed, and fired at 100 degree C., thereby forming the protection layer 6' (FIG. 3 (*e*)). Then, epoxy resin is screen-printed, and fired at 100 degree C., thereby forming interlayer insulation film 8 (FIG. 3 (*f*)). Further, Ag paste is screen-printed, and fired at 100 degree C., thereby forming the upper pixel electrode 9 (FIG. 3 (*g*)).

An electrophoretic material is disposed between the thin film transistor array produced in this way and a PET substrate having a transparent electrode and predetermined drive-voltage waveforms are applied, whereby excellent display results without any crosstalk are obtained. Also, a display which is resistant to degradation is obtained.

Example 3

With reference to FIG. 2 (*b*) and FIGS. 3(*a*)-3(*g*), hereinafter will be described the example 3 according to the present invention. The element as shown in FIG. 2 (*b*) is produced by manufacturing steps as shown in FIG. 3 (*a*) to FIG. 3 (*g*). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching (FIG. 3 (*a*)). Next, a solution of polyvinyl phenol is spin-coated and fired at 150 degree C., thereby forming polyvinyl phenol as the gate insulation film 3 with thickness of 1 µm (FIG. 3 (*b*)). Also, as the source electrode 4, the source wiring 4', the drain electrode 5 and the pixel electrode 7, Ag ink is offset-printed and fired at 180 degree C., thereby forming the pattern (FIG. 3 (*c*)). Moreover, a solution of polythiophene is flexographically printed and fired at 100 degree C. so as to form the semiconductor pattern 6 (FIG. 3 (*d*), it should be noted that the shape of the semiconductor pattern 6 has been set to be the same as that as shown in FIG. 2 (*a*)).

Subsequently, fluororesin is screen-printed and fired at 100 degree C., thereby forming the protection layer 6' (FIG. 3 (*e*)). Then, epoxy resin is screen-printed and fired at 100 degree C., thereby forming interlayer insulation film 8 (FIG. 3 (*f*)). Further, Ag paste is screen-printed and fired at 100 degree C., thereby forming the upper pixel electrode 9 (FIG. 3 (*g*)).

An electrophoretic material is disposed between the thin film transistor array produced in this way and a PET substrate having a transparent electrode and predetermined drive-voltage waveforms are applied, whereby excellent display results without any crosstalk are obtained. Also, a display which is resistant to degradation is obtained.

Example 4

With reference to FIG. 4 (*a*) and FIGS. 6(*a*)-6(*g*), hereinafter will be described the example 4 according to the present invention. The element as shown in FIG. 4 (*a*) is produced by manufacturing steps as shown in FIG. 6 (*a*) to FIG. 6 (*e*). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching (FIG. 6 (*a*)). Next, a solution of polyvinyl phenol is spin-coated and fired at 150 degree C., thereby forming polyvinyl phenol as the gate insulation film 3 with thickness of 1 µm (FIG. 6 (*b*)). Also, for the source electrode 4, the source wiring 4, the drain electrode 5 and the pixel electrode 7, Ag ink is offset-printed and fired at 180 degree C., thereby forming the pattern (FIG. 6 (*c*)). Moreover, a solution of polythiophene is flexographically printed and fired at 100 degree C. so as to form the semiconductor pattern 6 (FIG. 6 (*d*)).

Subsequently, fluororesin is screen-printed and fired at 100 degree C., thereby forming the protection layer 6' (FIG. 6 (*e*)).

An electrophoretic material is disposed between the thin film transistor array produced in this way and a PET substrate having a transparent electrode and predetermined drive-voltage waveforms are applied, whereby excellent display result without any crosstalk are obtained. Also, a display which is resistant to degradation is obtained.

Example 5

With reference to FIG. 4 (*b*) and FIGS. 6(*a*)-6(*g*), hereinafter will be described example 5 according to the present invention. The element as shown in FIG. 4 (*b*) is produced by manufacturing steps as shown in FIG. 6 (*a*) to FIG. 6 (*g*). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching (FIG. 6 (*a*)). Next, a solution of polyvinyl phenol is spin-coated and fired at 150 degree C., thereby forming polyvinyl phenol as the gate insulation film 3 with thickness of 1 µm (FIG. 6 (*b*)). Also, as the source electrode 4, the source wiring 4, the drain electrode 5 and the pixel electrode 7, Ag ink is offset-printed and fired at 180 degree C., thereby forming the pattern (FIG. 6 (*c*)). Moreover, a solution of polythiophene is flexographically printed and fired at 100 degree C. so as to form the semiconductor pattern 6 (FIG. 6 (*d*)).

Subsequently, fluororesin is screen-printed and fired at 100 degree C., thereby forming the protection layer 6' (FIG. 6 (*e*)). Then, epoxy resin is screen-printed and fired at 100 degree C., thereby forming interlayer insulation film 8 (FIG. 6 (*f*)). Further, Ag paste is screen-printed and fired at 100 degree C., thereby forming the upper pixel electrode 9 (FIG. 6 (*g*)).

An electrophoretic material is disposed between the thin film transistor array produced in this way and a PET substrate having a transparent electrode and predetermined drive-voltage waveforms are applied, whereby excellent display results without any crosstalk are obtained. Also, a display which is resistant to degradation is obtained.

Example 6

With reference to FIG. 5 (*b*) and FIGS. 6(*a*)-6(*g*), hereinafter will be described the example 6 according to the present invention. The element as shown in FIG. 5 (*b*) is produced by manufacturing steps as shown in FIG. 6 (*a*) to FIG. 6 (*g*). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching (FIG. 6 (*a*)). Next, a solution of polyvinyl phenol is spin-coated and fired at 150 degree C., thereby forming polyvinyl phenol as the gate insulation film 3 with thickness of 1 μm (FIG. 6 (*b*)). Also, as the source electrode 4, the source wiring 4, the drain electrode 5 and the pixel electrode 7, Ag ink is offset-printed and fired at 180 degree C., thereby forming the pattern (FIG. 6 (*c*)). Moreover, a solution of polythiophene is flexographically printed and fired at 100 degree C. so as to form the semiconductor pattern 6 (FIG. 6 (*d*), it should be noted that a shape of the semiconductor pattern 6 is the same as that as shown in FIG. 5 (*a*)).

Subsequently, fluororesin is screen-printed and fired at 100 degree C., thereby forming the protection layer 6' (FIG. 6 (*e*)). Then, epoxy resin is screen-printed and fired at 100 degree C., thereby forming interlayer insulation film 8 (FIG. 6 (*f*)). Further, Ag paste is screen-printed and fired at 100 degree C., thereby forming the upper pixel electrode 9 (FIG. 6 (*g*)).

An electrophoretic material is disposed between the thin film transistor array produced in this way and a PET substrate having a transparent electrode and predetermined drive-voltage waveforms are applied, whereby excellent display result without any crosstalk are obtained. Also, a display which is resistant to degradation is obtained.

Example 7

With reference to FIG. 7 (*b*) and FIGS. 8(*a*)-8(*g*), hereinafter will be described the example 7 according to the present invention. The element as shown in FIG. 7 (*b*) is produced by manufacturing steps as shown in FIG. 8 (*a*) to FIG. 8 (*g*). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching (FIG. 8 (*a*)). Next, a solution of polyvinyl phenol is spin-coated and fired at 150 degree C., thereby forming polyvinyl phenol as the gate insulation film 3 with thickness of 1 μm (FIG. 8 (*b*)). Further, a solution of polythiophene is flexographically printed and fired at 100 degree C. so as to form the semiconductor pattern 6 (FIG. 8 (*c*)). Moreover, as the source electrode 4, the source wiring 4, the drain electrode 5 and the pixel electrode 7, Ag ink is offset-printed and fired at 180 degree C., thereby forming the pattern (FIG. 8 (*d*)).

Subsequently, fluororesin is screen-printed and fired at 100 degree C., thereby forming the protection layer 6' (FIG. 8 (*e*)). Then, epoxy resin is screen-printed and fired at 100 degree C., thereby forming interlayer insulation film 8 (FIG. 8 (*f*)). Further, Ag paste is screen-printed and fired at 100 degree C., thereby forming the upper pixel electrode 9 (FIG. 8 (*g*)).

An electrophoretic material is disposed between the thin film transistor array produced in this way and a PET substrate having a transparent electrode and predetermined drive-voltage waveforms are applied, whereby excellent display result without any crosstalk are obtained. Also, a display which is resistant to degradation is obtained.

Example 8

With reference to FIGS. 9(*a*)(*b*) and FIGS. 3(*a*)-3(*g*), hereinafter will be described the example 8 according to the present invention. The element as shown in FIGS. 9(*a*)(*b*) is produced by manufacturing steps as shown in FIG. 3 (*a*) to FIG. 3 (*g*). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching (FIG. 3 (*a*), it should be noted that a shape of the gate electrode 2 is the same as that as shown in FIGS. 9(*a*)(*b*)). Next, a solution of polyvinyl phenol is spin-coated and fired at 150 degree C., thereby forming polyvinyl phenol as the gate insulation film 3 with thickness of 1 μm (FIG. 3 (*b*)). Also, as the source electrode 4, the source wiring 4, the drain electrode 5 and the pixel electrode 7, Ag ink is offset-printed and fired at 180 degree C., thereby forming the pattern (FIG. 3 (*c*)). Moreover, a solution of polythiophene is flexographically printed and fired at 100 degree C. so as to form the semiconductor pattern 6 (FIG. 3 (*d*)).

Subsequently, fluororesin is screen-printed and fired at 100 degree C., thereby forming the protection layer 6' (FIG. 3 (*e*)). Then, epoxy resin is screen-printed and fired at 100 degree C., thereby forming interlayer insulation film 8 (FIG. 3 (*f*)). Further, Ag paste is screen-printed and fired at 100 degree C., thereby forming the upper pixel electrode 9 (FIG. 3 (*g*)).

An electrophoretic material is disposed between the thin film transistor array produced in this way and a PET substrate having a transparent electrode and predetermined drive-voltage waveforms are applied, whereby excellent display result without any crosstalk are obtained. Also, a display which is resistant to degradation is obtained. However, short-circuits sometimes occur between the gate and the capacitor, and the yield is low.

Example 9

Figure 10A:
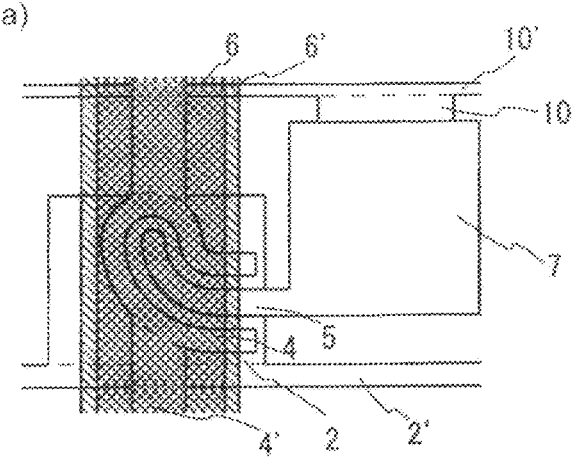
FIGS. 10(a) and 10(b) are planar views showing a configuration example of a thin film transistor array of which the gate electrode is quadrangle, manufactured by a manufacturing method as shown in FIGS. 6(a)-6(g)
Figure 10B:
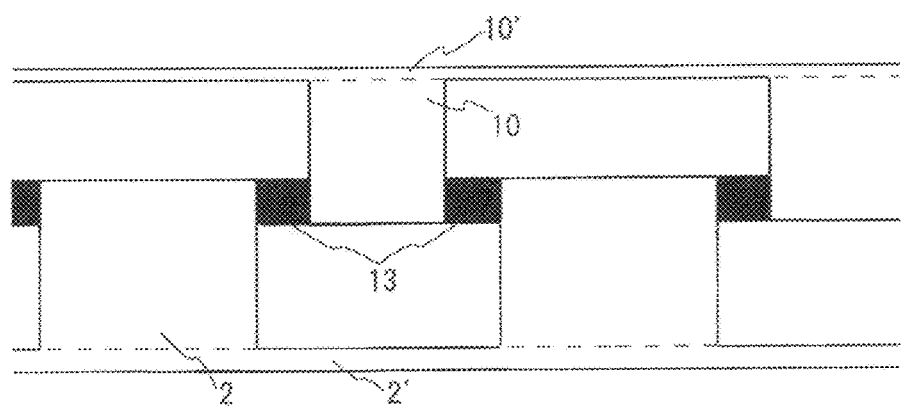
Figure 11:
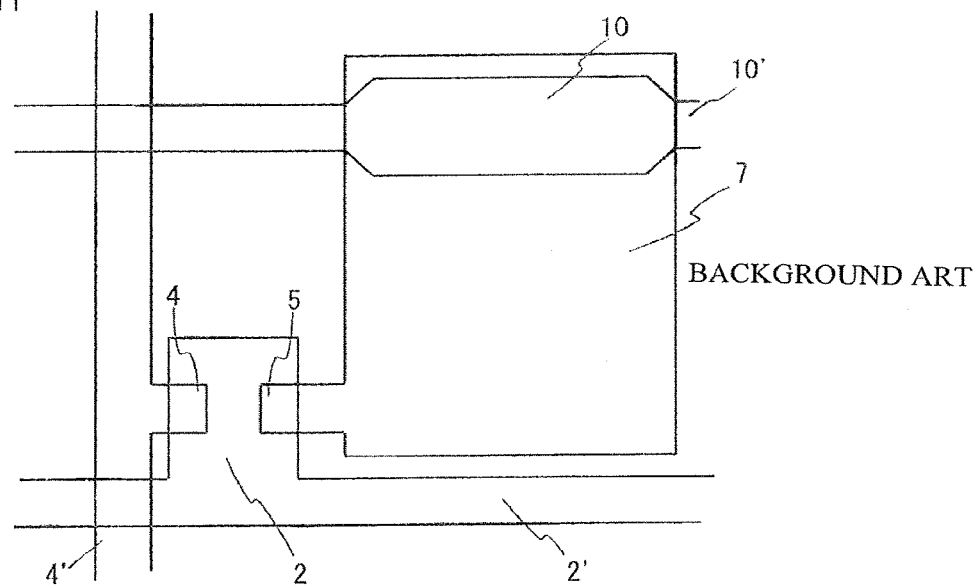
FIG. 11 is a planar view showing a configuration example of a conventional thin film transistor array.

With reference to FIGS. 10(*a*)(*b*) and FIGS. 6(*a*)-6(*g*), hereinafter will be described example 9 according to the present invention. The element as shown in FIGS. 10(*a*)(*b*) is produced by manufacturing steps as shown in FIG. 6 (*a*) to FIG. 6 (*g*). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching (FIG. 6 (*a*), it should be noted that the shape of the gate electrode 2 is the same as that as shown in FIGS. 10(a)(b)). Next, a solution of polyvinyl phenol is spin-coated and fired at 150 degree C., thereby forming polyvinyl phenol as the gate insulation film 3 with a thickness of 1 μm (FIG. 6 (b)). Also, as the source electrode 4, the source wiring 4, the drain electrode 5 and the pixel electrode 7, Ag ink is offset-printed and fired at 180 degree C., thereby forming the pattern (FIG. 6 (c)). Moreover, a solution of polythiophene is flexographically printed and fired at 100 degree C. so as to form the semiconductor pattern 6 (FIG. 6 (d)).

Subsequently, fluororesin is screen-printed and fired at 100 degree C., thereby forming the protection layer 6' (FIG. 6 (e)). Then, epoxy resin is screen-printed and fired at 100 degree C., thereby forming interlayer insulation film 8 (FIG. 6 (f)). Further, Ag paste is screen-printed and fired at 100 degree C., thereby forming the upper pixel electrode 9 (FIG. 6 (g)).

An electrophoretic material is disposed between the thin film transistor array produced in this way and a PET substrate having a transparent electrode and predetermined drive-voltage waveforms are applied, whereby excellent display result without any crosstalk are obtained. Also, a display which is resistant to degradation is obtained. However, short-circuits sometimes occur between the gate and the capacitor and the yield is low.

Comparative Example 1

Figure 12:
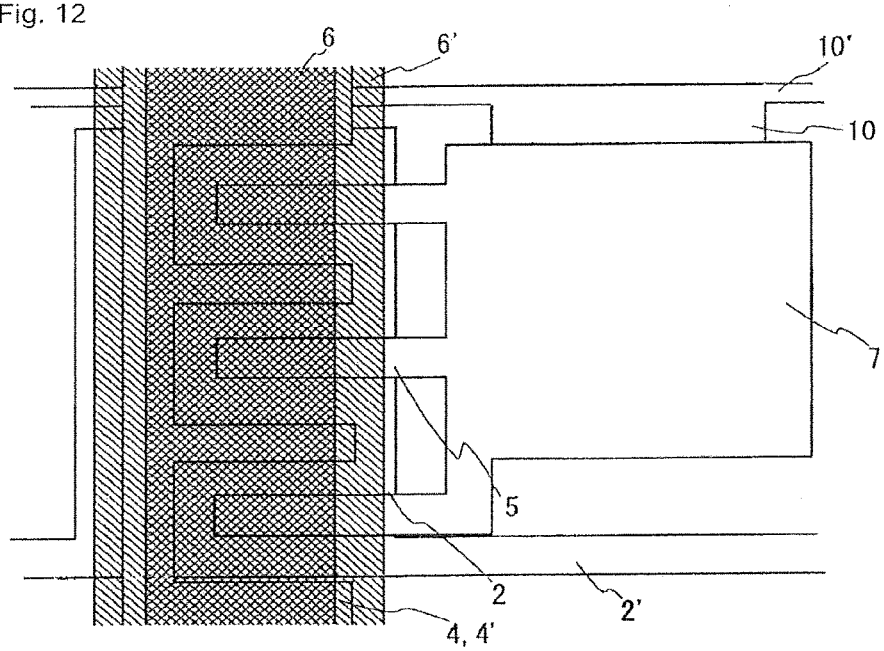
FIG. 12 is a planar view showing a second configuration example of a conventional thin film transistor array.

The comparative example 1 is described with reference to FIG. 12. An element as shown in FIG. 12 is produced with similar manufacturing steps as in FIGS. 3(a)-3(g). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching. Next, a solution of polyvinyl phenol is spin-coated and fired at 150 degree C., thereby forming polyvinyl phenol as the gate insulation film 3 with thickness of 1 μm. Also, as the source electrode 4, the source wiring 4', the drain electrode 5 and the pixel electrode 7, Ag ink is offset-printed and fired at 180 degree C., thereby forming the pattern. Moreover, a solution of polythiophene is flexographically printed and fired at 100 degree C. so as to form the semiconductor pattern 6.

Subsequently, fluororesin is screen-printed and fired at 100 degree C., thereby forming the protection layer 6'. Then, epoxy resin is screen-printed and fired at 100 degree C., thereby forming interlayer insulation film 8. Further, Ag paste is screen-printed and fired at 100 degree C., thereby forming the upper pixel electrode 9.

Figure 15:
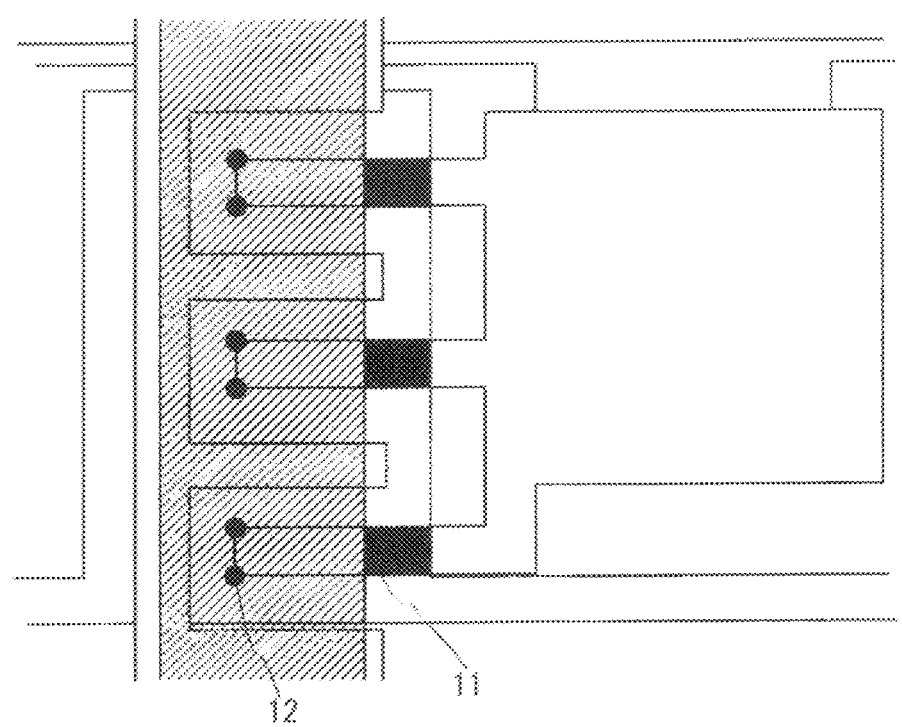
FIG. 15 is a planar view showing a configuration example of a thin film transistor of which the drain electrode has a comb-like shape.

When an electrophoretic material is disposed between the thin film transistor array produced in this way and a PET substrate having a transparent electrode and predetermined drive-voltage waveforms are applied, crosstalk occurs. By increasing the gate voltage to be ±25 volts not the usual ±20 volts, the crosstalk is eliminated. This is because the gate-drain capacitance is high. When it is driven for long periods, degradation is observed at the angle portion 12 of the drain electrode 5 and the source electrode 4 (FIG. 15).

Comparative Example 2

Figure 16A:
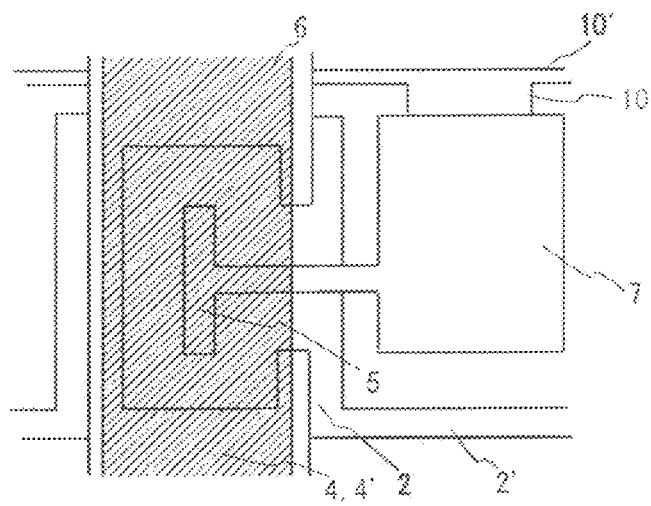
FIGS. 16(a)-16(c) are planar views showing a configuration example of a thin film transistor array in which the drain electrode has a T-shape and long channel length.
Figure 16B:
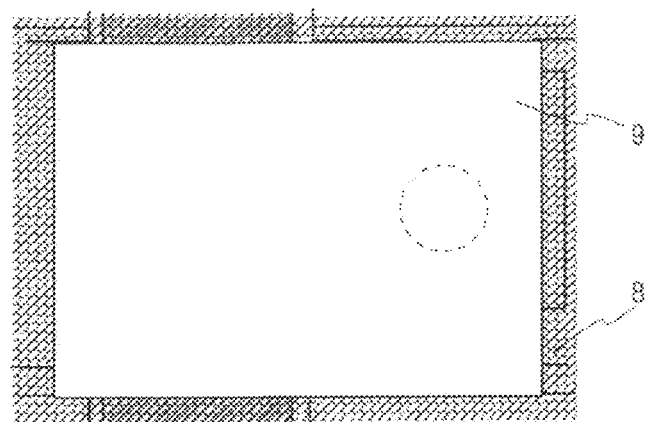
Figure 16C:
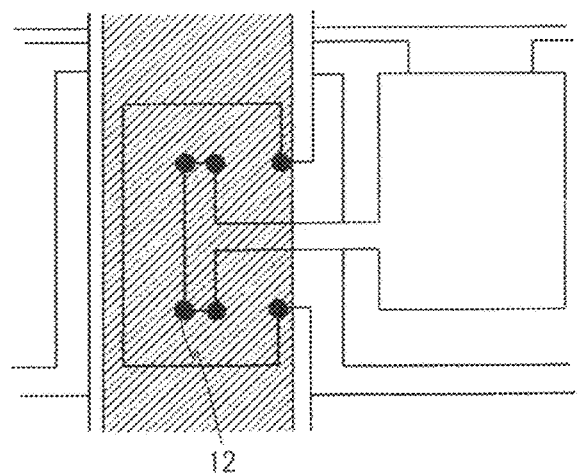

The comparative example 2 is described with reference to FIG. 16(a)-16(c). An element as shown in FIGS. 16(a)-(c) is produced with similar manufacturing step of FIGS. 3(a)-3(g). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching. Next, a solution of polyvinyl phenol is spin-coated and fired at 150 degree C., thereby forming polyvinyl phenol as the gate insulation film 3 with thickness of 1 μm. Also, for the source electrode 4, the source wiring 4, the drain electrode 5 and the pixel electrode 7, Ag ink is offset-printed and fired at 180 degree C., thereby forming the pattern. Moreover, a solution of polythiophene is flexographically printed and fired at 100 degree C. so as to form the semiconductor pattern 6.

Subsequently, fluororesin is screen-printed and fired at 100 degree C., thereby forming the protection layer 6'. Then, epoxy resin is screen-printed and fired at 100 degree C., thereby forming interlayer insulation film 8. Further, Ag paste is screen-printed and fired at 100 degree C., thereby forming the upper pixel electrode 9.

When an electrophoretic material is disposed between the thin film transistor array produced in this way and a PET substrate having a transparent electrode and predetermined drive-voltage waveforms are applied, slight crosstalk occurs. This is because the gate-drain capacitance is high. Also, power consumption is high. When it is driven for long periods, degradation is observed at the angle portion 12 of the drain electrode 5 and the source electrode 4.

Comparative Example 3

Figure 17A:
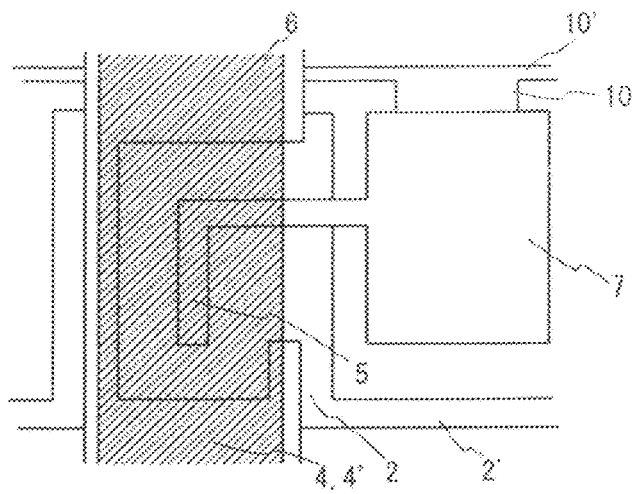
FIGS. 17(a)-17(c) are planar views showing a configuration example of a thin film transistor array in which the drain electrode has an L-shape and long channel length.
Figure 17B:
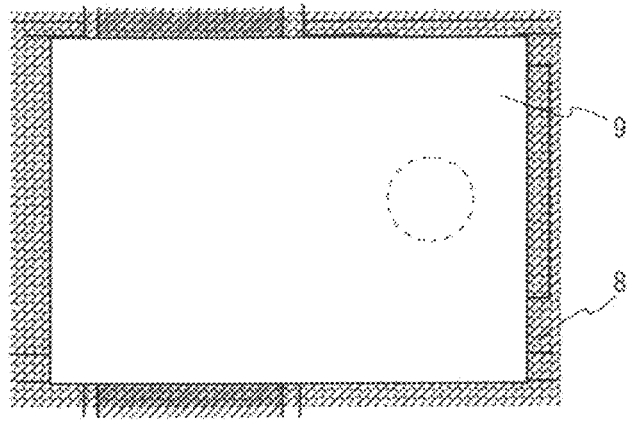
Figure 17C:
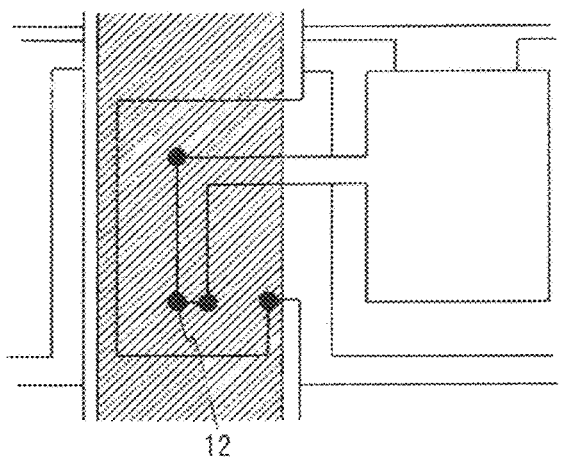

The comparative example 3 is described with reference to FIGS. 17(a)-17(c). An element as shown in FIGS. 17(a)-17(c) is produced with similar manufacturing step of FIGS. 3(a)-3(g). First, an Al is film-formed by vapor deposition to have a thickness of 50 nm on PEN which is the insulation substrate 1, and the gate electrode 2, the gate wiring 2, the capacitor electrode 10 and the capacitor wiring 10' are formed by photolithography and wet etching. Next, a solution of polyvinyl phenol is spin-coated and fired at 150 degree C., thereby forming polyvinyl phenol as the gate insulation film 3 with thickness of 1 μm. Also, for the source electrode 4, the source wiring 4, the drain electrode 5 and the pixel electrode 7, Ag ink is offset-printed and fired at 180 degree C., thereby forming the pattern. Moreover, a solution of polythiophene is flexographically printed and fired at 100 degree C. so as to form the semiconductor pattern 6.

Subsequently, fluororesin is screen-printed and fired at 100 degree C., thereby forming the protection layer 6'. Then, epoxy resin is screen-printed and fired at 100 degree C., thereby forming interlayer insulation film 8. Further, Ag paste is screen-printed and fired at 100 degree C., thereby forming the upper pixel electrode 9.

When an electrophoretic material is disposed between the thin film transistor array produced in this way and a PET substrate having a transparent electrode and predetermined drive-voltage waveforms are applied, slight crosstalk occurs. This is because the gate-drain capacitance is high. Also, power consumption is high. When it is driven for long periods, degradation is observed at the angle portion 12 of the drain electrode 5 and the source electrode 4.

Thus, a bottom gate structure is described in which the gate electrode 2 is disposed at a layer lower than the source electrode 4 and the drain electrode 5. However, a similar shape of electrodes may be provided as a top gate structure in which the gate electrode 2 is disposed at a layer higher than the source electrode and the drain electrode. In this case, openings need to be disposed in not only the interlayer insulation film but also the gate insulation film. Moreover, the upper pixel electrode is necessary and it is also necessary to avoid short-circuit between the pixel electrode and the capacitor electrode (that is, it should be avoided that the capacitor electrode contacts with the openings of the gate insulation layer).

As can be understood from the above description, the present invention has the following effects. First, the gate-source capacitance, the source-pixel capacitance, the gate-pixel capacitance can be lowered so that a thin film transistor having excellent display quality can be obtained. Moreover, since the drain electrode and the source electrode do not have portions causing current concentration, a thin film transistor causing very little degradation can be obtained. Furthermore, the distance between the gate and the capacitor can be longer so that a thin film transistor having less defects can be obtained.

As a TFT array suitable for a printing method, we have invented a structure in which a channel portion is located in a source wiring region and the channel portion and the source wiring are covered by a stripe insulation layer (PTL1). By this structure, since a TFT region does not have to be provided outside the source wiring 4, the TFT can be obtained with a larger area of the pixel electrode 7.

However, in a comb-like structure as shown in FIG. 12, in a drain electrode 5, a portion which is overlapped with a gate electrode 2 without forming a channel, i.e., a portion 11 for supplying power up to the channel, is present in plural number (FIG. 15). Hence, a gate-drain capacitance (i.e., capacitance between the gate and the pixel) becomes large, so that a so called gate feed-through voltage in which the voltage change of the gate from ON to OFF influences the pixel voltage potential, becomes large. As a result, a problem arises that display quality is degraded.

Also, in a case where T-shape as shown in FIG. 13 or L-shape as shown in FIG. 14 is used, when making the channel length larger, the width of the source wiring 4' becomes wider as twice as that of the channel length so that a problem arises that the gate-source capacitance becomes large (FIG. 16 (a), FIG. 17 (a)). Further, as shown in FIG. 16 (b) or FIG. 17 (b), in a case where structure has an interlayer insulation layer 8 and an upper pixel electrode 9, there is a problem that the source-pixel capacitance becomes large. In a case where the gate-source capacitance becomes large, excessive charge/discharge current flows, thereby increasing power consumption. If the source-pixel capacitance is larger, a source coupling due to an influence of a change in the source voltage becomes large, whereby display quality is degraded.

Also, as shown in FIG. 15, FIG. 16 (c), FIG. 17 (c), in a case where an angle portion 12 having an interior angle less than 180 degrees exists at a drain electrode 5 and/or a source electrode 4 that forms a channel, current concentration occurs at the apex portion. Therefore, a problem arises that a semiconductor pattern 6 at the drain electrode 5 and/or the source electrode 4 and the vicinity of the apex portion are likely to deteriorate.

Moreover, there has been an issue that a short circuit between the gate and the capacitor is likely to occur at a portion where the interval between the gate electrode 2 and the capacitor electrode 10 is small.

The present invention is achieved in light of the aforementioned circumstances in the related art and its object is to provide a thin film transistor array having small gate-source capacitance, a small source-pixel capacitance, a small gate-drain capacitance (i.e., gate-pixel capacitance), causing less deterioration, and having fewer defects.

As an aspect to achieve the above-described object, the thin film transistor array, on an insulation substrate, includes: a gate electrode and a gate wiring connected to the gate electrode; a capacitor electrode and a capacitor wiring connected to the capacitor electrode; a gate insulation layer; a source electrode and a drain electrode, having a gap in an area overlapped with the gate electrode in planar view; a semiconductor pattern disposed at least corresponding to the gap; a source wiring connected to the source electrode; a pixel electrode connected to the drain electrode, the pixel electrode is overlapping with the capacitor electrode in planar view; and a protection layer that covers over the semiconductor pattern.

In planar view, the drain electrode has a single line shape having fixed width, and the source electrode has a line shape and also a sheath shape surrounding the drain electrode with a constant interval away from the drain electrode. The source wiring is formed to connect between a plurality of source electrodes. The source wiring is narrower than the width of a region of a semiconductor pattern corresponding in location to the gap between the source electrode and the drain electrode and extending perpendicular to a direction where a gate wiring extends.

The thin film transistor array may be configured such that in planar view, the source wiring is disposed within a semiconductor pattern region corresponding in location to a portion between the source electrode and the drain electrode, and the semiconductor pattern region extends perpendicular to a direction where the gate wiring extends.

The thin film transistor array may be configured such that in planar view, the drain electrode is extended bending from a direction parallel to an extending direction of the gate wiring, to a direction parallel to an extending direction of the source wiring; and the sheath shape of the source electrode has a curved shape along an extending direction of the drain electrode.

The thin film transistor array may be configured such that in planar view, a tip end portion of the drain electrode has a round shape; and a tip end portion of the sheath shape of the source electrode has a curved shape along the tip end portion of the drain electrode.

The thin film transistor array may be configured such that in planar view, the semiconductor pattern has a stripe shape extending over a plurality of thin film transistors in an extending direction along the source wiring.

The thin film transistor array may be configured such that in planar view, an edge of the semiconductor pattern intersects the drain electrode and vicinity of tip end portion of an opening in the sheath shape of the source electrode that surrounds the drain electrode.

The thin film transistor array may be configured such that in planar view, the protection layer has a stripe shape extending over a plurality of thin film transistors in an extending direction along the source wiring.

The thin film transistor array may be configured such that in planar view, the gate electrode is formed not in a rectangular shape but in a curved shape or a polygonal shape along the curved shape of the source electrode.

The thin film transistor array may further include an interlayer insulation film having a hole on the pixel electrode; and an upper pixel electrode connected to the pixel electrode via the hole of the interlayer insulation film.

According to the present invention, thin film transistor having excellent display quality, fewer defects and causing less deterioration can be provided.

INDUSTRIAL APPLICABILITY

The present invention can be applicable to a thin film transistor array of liquid crystal display device, an electronic paper and an organic EL display device.

DESCRIPTION OF REFERENCE NUMERALS

1: insulation substrate
2: gate electrode
2': gate wiring
3: gate insulation layer
4: source electrode
4': source wiring
5: drain electrode
6: semiconductor pattern
6': protection layer
7: pixel electrode
8: interlayer insulation film
8A: hole of interlayer insulation film
9: upper pixel electrode
10: capacitor electrode
10': capacitor wiring
11: portion which is overlapped with a gate electrode without forming a channel in drain electrode
12: apex of angle portion where interior angle is less than 180 degrees at drain electrode and/or source electrode
13: portion where the distance between gate and capacitor is small Obviously, numerous modifications and variations of the present invention are possible in light of the above teachings. It is therefore to be understood that within the scope of the appended claims, the invention may be practiced otherwise than as specifically described herein.

What is claimed is:

1. A thin film transistor array, comprising:
    a gate electrode;
    a gate wiring connected to the gate electrode and extended in a first direction;
    a source electrode;
    a source wiring connected to the source electrode;
    a drain electrode having a gap from the source electrode in an area overlapped with the gate electrode in a planar view;
    a semiconductor pattern formed at least in a portion corresponding to the gap between the source electrode and the drain electrode, the semiconductor pattern having a region defined by extending the portion in a second direction perpendicular to the first direction;
    a capacitor electrode; and
    a pixel electrode connected to the drain electrode such that the pixel electrode overlaps with the capacitor electrode in the planar view,
    wherein, in the planar view, the drain electrode has a shape of a single line, the source electrode has a portion in a sheath shape surrounding the drain electrode and keeping a space from the drain electrode, the source wiring has a width narrower than a width of the region of the semiconductor pattern, the source electrode has at least a portion outside an area in which the semiconductor pattern is formed, and the drain electrode has two end points forming a continuous line with a midpoint between the two end points and wherein a width of the drain electrode at the midpoint is a same as at one of the two end points that is outside the area in which the semiconductor pattern is formed, and
    wherein in the planar view, the source wiring is formed within the region of the semiconductor pattern, and
    wherein in the planar view, the semiconductor pattern has an edge portion that intersects the drain electrode and the portion of the source electrode in the sheath shape.

2. The thin film transistor array according to claim 1, wherein in the planar view, the drain electrode is extended in the first direction and bent to the second direction, and the sheath shape of the source electrode has a curved shape along a direction in which the drain electrode is bent.

3. The thin film transistor array according to claim 2, wherein in the planar view, the gate electrode is formed in a curved shape or a polygonal shape around the curved shape of the source electrode.

4. The thin film transistor array according to claim 2, further comprising:
    a protection layer covering the semiconductor pattern,
    wherein in the planar view, the protection layer has a stripe shape extending over a plurality of thin film transistors in the second direction.

5. The thin film transistor array according to claim 2, further comprising:
    an interlayer insulation film having a hole over the pixel electrode; and
    an upper pixel electrode connected to the pixel electrode via the hole of the interlayer insulation film.

6. The thin film transistor array according to claim 1, wherein in the planar view, the drain electrode has an end portion in a round shape, and the portion of the source electrode in the sheath shape has a curved end portion extending along the end portion of the drain electrode.

7. The thin film transistor array according to claim 1, wherein in the planar view, the semiconductor pattern has a stripe shape extending over a plurality of thin film transistors in the second direction.

8. The thin film transistor array according to claim 1, further comprising:
    a protection layer covering the semiconductor pattern,
    wherein in the planar view, the protection layer has a stripe shape extending over a plurality of thin film transistors in the second direction.

9. The thin film transistor array according to claim 1, further comprising:
    an interlayer insulation film having a hole over the pixel electrode; and
    an upper pixel electrode connected to the pixel electrode via the hole of the interlayer insulation film.

10. The thin film transistor array according to claim 1, wherein the source electrode is formed in a plurality and connected by the source wiring.

11. The thin film transistor array according to claim 1, wherein the drain electrode is formed between the semiconductor pattern and gate electrode.

12. The thin film transistor array according to claim 11, wherein in the planar view, the drain electrode is extended in the first direction and bent to the second direction, and the sheath shape of the source electrode has a curved shape along a direction in which the drain electrode is bent.

13. The thin film transistor array according to claim 12, wherein in the planar view, the gate electrode is formed in a curved shape or a polygonal shape around the curved shape of the source electrode.

14. The thin film transistor array according to claim 11, wherein in the planar view, the drain electrode has an end portion in a round shape, and the portion of the source electrode in the sheath shape has a curved end portion extending along the end portion of the drain electrode.

15. The thin film transistor array according to claim 11, wherein in the planar view, the semiconductor pattern has an edge portion that intersects the drain electrode and the portion of the source electrode in the sheath shape.

16. The thin film transistor array according to claim 11, further comprising:
a protection layer covering the semiconductor pattern,
wherein in the planar view, the protection layer has a stripe shape extending over a plurality of thin film transistors in the second direction.

17. The thin film transistor array according to claim 11, further comprising:
an interlayer insulation film having a hole over the pixel electrode; and
an upper pixel electrode connected to the pixel electrode via the hole of the interlayer insulation film.

18. The thin film transistor array according to claim 11, wherein the source electrode is formed in a plurality and connected by the source wiring.

19. A thin film transistor array, comprising:
a gate electrode;
a gate wiring connected to the gate electrode and extended in a first direction;
a source electrode;
a source wiring connected to the source electrode;
a drain electrode having a gap from the source electrode in an area overlapped with the gate electrode in a planar view;
a semiconductor pattern formed at least in a portion corresponding to the gap between the source electrode and the drain electrode, the semiconductor pattern having a region defined by extending the portion in a second direction perpendicular to the first direction;
a capacitor electrode; and
a pixel electrode connected to the drain electrode such that the pixel electrode overlaps with the capacitor electrode in the planar view,
wherein, in the planar view, the drain electrode has a shape of a single line, the source electrode has a portion in a sheath shape surrounding the drain electrode and keeping a space from the drain electrode, the source wiring has a width narrower than a width of the region of the semiconductor pattern, the source electrode has at least a portion outside an area in which the semiconductor pattern is formed, and the drain electrode has two end points forming a continuous line with a midpoint between the two end points and wherein a width of the drain electrode at the midpoint is a same as at one of the two end points that is outside the area in which the semiconductor pattern is formed, and
wherein in the planar view, the source wiring is formed within the region of the semiconductor pattern, and
wherein in the planar view, the semiconductor pattern has a stripe shape extending over a plurality of thin film transistors in the second direction.

* * * * *